(12) United States Patent
Kim et al.

(10) Patent No.: US 11,763,879 B2
(45) Date of Patent: Sep. 19, 2023

(54) MEMORY DEVICE

(71) Applicant: Samsung Electronics Co., Ltd., Suwon-si (KR)

(72) Inventors: Yoonjee Kim, Suwon-si (KR); Seungyeon Kim, Seoul (KR); Sangwan Nam, Hwaseong-si (KR); Hongsoo Jeon, Suwon-si (KR); Jiho Cho, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 45 days.

(21) Appl. No.: 17/322,065

(22) Filed: May 17, 2021

(65) Prior Publication Data

US 2022/0122651 A1 Apr. 21, 2022

(30) Foreign Application Priority Data

Oct. 15, 2020 (KR) .................. 10-2020-0133419

(51) Int. Cl.
| | | |
|---|---|---|
| *G11C 11/4097* | (2006.01) | |
| *G11C 5/06* | (2006.01) | |
| *G11C 11/4093* | (2006.01) | |
| *G11C 11/408* | (2006.01) | |
| *G11C 11/4099* | (2006.01) | |

(52) U.S. Cl.
CPC ........... *G11C 11/4097* (2013.01); *G11C 5/06* (2013.01); *G11C 11/4085* (2013.01); *G11C 11/4087* (2013.01); *G11C 11/4093* (2013.01); *G11C 11/4099* (2013.01)

(58) Field of Classification Search
CPC .... G11C 11/4097; G11C 5/06; G11C 11/4099
USPC .................................................... 365/185.18
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |

(Continued)

*Primary Examiner* — Anthan Tran
(74) *Attorney, Agent, or Firm* — Harness, Dickey & Pierce, P.L.C.

(57) ABSTRACT

A memory device includes a peripheral circuit area including a first substrate and circuit elements on the first substrate, at least a portion of the circuit elements providing a source driver, and a cell area including a second substrate stacked with the peripheral circuit area in a first direction, perpendicular to an upper surface of the first substrate, and cell blocks and dummy blocks arranged in a second direction, parallel to an upper surface of the second substrate. Each of the cell blocks includes gate electrode layers and insulating layers alternately stacked on the second substrate, and channel structures extending in the first direction to penetrate through the gate electrode layers and the insulating layers and to be connected to the second substrate, at least one source contact block, among the dummy blocks, includes a first dummy insulating region on the second substrate, and source contacts extending in the first direction, penetrating through the first dummy insulating region and connected to the second substrate, and the source contacts are connected to the source driver through metal wirings in an upper portion of the cell area.

20 Claims, 26 Drawing Sheets

(56) References Cited

U.S. PATENT DOCUMENTS

| | | |
|---|---|---|
| 8,897,089 B2 | 11/2014 | Kim et al. |
| 2011/0233648 A1 | 9/2011 | Seol et al. |
| 2015/0332771 A1* | 11/2015 | Kwon .................... G11C 16/10 365/185.11 |
| 2019/0267333 A1* | 8/2019 | Hong ................ H01L 27/11565 |
| 2020/0194453 A1 | 6/2020 | Lim |
| 2021/0202496 A1 | 7/2021 | Nam et al. |

* cited by examiner

MEMORY DEVICE

CROSS-REFERENCE TO RELATED APPLICATION(S)

This application claims the benefit under 35 USC 119(a) of Korean Patent Application No. 10-2020-0133419 filed on Oct. 15, 2020 in the Korean Intellectual Property Office, the entire disclosure of which is incorporated herein by reference for all purposes.

BACKGROUND

The present inventive concepts relate to a memory device.

Memory devices may include cell areas in which memory cells for writing data are disposed, and peripheral circuit areas in which circuits controlling the cell areas are disposed. The peripheral circuit area and the cell area are connected by a word line, a common source line and a bit line, and the peripheral circuit area may execute a control operation such as a programming operation, a reading operation, and an erase operation through a word line, a common source line, and a bit line.

SUMMARY

Example embodiments provide a memory device in which variations in voltage input to a common source line are significantly reduced by efficiently disposing source contacts connected to the common source line, and operating characteristics and reliability are improved.

According to example embodiments, a memory device includes a peripheral circuit area including a first substrate and circuit elements on the first substrate, at least a portion of the circuit elements providing a source driver, and a cell area including a second substrate stacked with the peripheral circuit area in a first direction, perpendicular to an upper surface of the first substrate, and cell blocks and dummy blocks arranged in a second direction, parallel to an upper surface of the second substrate. Each of the cell blocks includes gate electrode layers and insulating layers alternately stacked on the second substrate, and channel structures extending in the first direction to penetrate through the gate electrode layers and the insulating layers and to be connected to the second substrate, at least one source contact block, among the dummy blocks, includes a first dummy insulating region on the second substrate, and source contacts extending in the first direction, penetrating through the first dummy insulating region and connected to the second substrate, and the source contacts are connected to the source driver through metal wirings in an upper portion of the cell area.

According to example embodiments, a memory device includes a peripheral circuit area including circuit elements providing a source driver, a row decoder and a page buffer, and a cell area on the peripheral circuit area in a first direction and including blocks arranged in a second direction intersecting the first direction, the blocks being separated from each other by separation layers extending in a third direction intersecting the second direction. The blocks include a cell block in which memory cells are disposed, a source contact block in which source contacts extending in the first direction and connected to a source region of the cell area are disposed, and a bit line contact block in which bit line contacts extending in the first direction and connected to the page buffer are disposed, and the source contact block is adjacent to the cell block and the bit line contact block in the second direction.

According to example embodiments, a memory device includes a cell area including a substrate having a source region, gate lines stacked in a first direction, perpendicular to an upper surface of the substrate, channel layers extending in the first direction and penetrating through the gate lines and connected to the source region, and source contacts extending in the first direction and connected to the source region and separated from the gate lines in a second direction, parallel to the upper surface of the substrate, and a peripheral circuit area below the cell area in the first direction and including a source driver electrically connected to the source region. The memory device includes lower metal wirings connected to the source contacts at a first height from the upper surface of the substrate and extending in the second direction, upper metal wirings connected to the lower metal wirings at a higher level than the first height, and a through-wiring extending in the first direction and connecting the upper metal wirings to the source driver.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments will be described with reference to the accompanying drawings.

Figure 1:
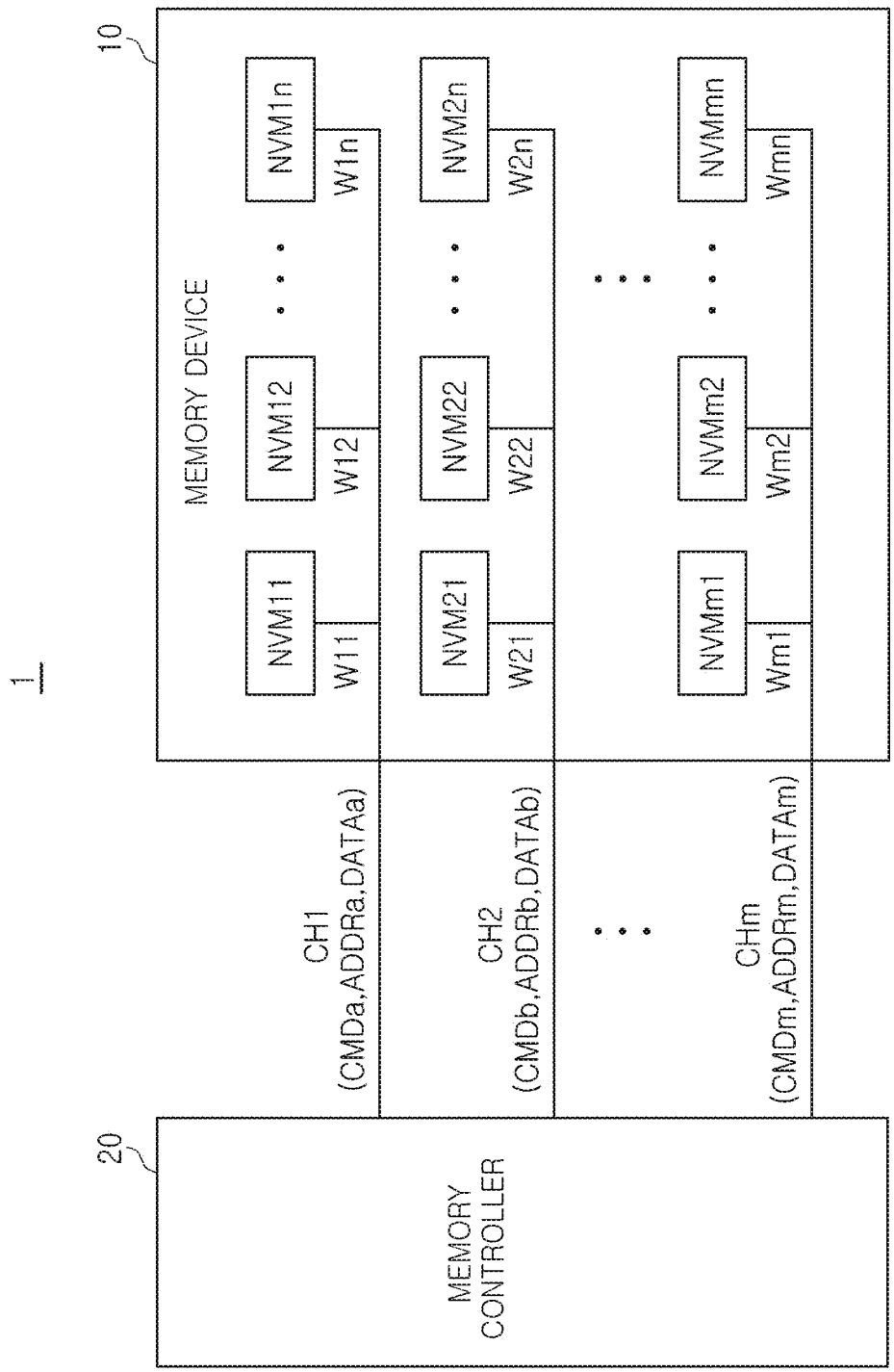
FIG. 1 is a block diagram schematically illustrating a system including a memory device according to example embodiments.

FIG. 1 is a block diagram schematically illustrating a system including a memory device according to example embodiments.

Referring to FIG. 1, a memory system 1 may include a memory device 10 and a memory controller 20. The memory system 1 may support a plurality of channels CH1 to CHm, and the memory device 10 and the memory controller 20 may be connected by a plurality of channels CH1 to CHm. For example, the memory system 1 may be implemented as a storage device such as a solid state drive (SSD).

The memory device 10 may include a plurality of memory devices NVM11 to NVMmn. Each of the memory devices NVM11 to NVMmn may be connected to one of the plurality of channels CH1 to CHm through a corresponding way. For example, the memory devices NVM11 to NVM1$n$ are connected to the first channel CH1 through the ways W11 to W1$n$, and the memory devices NVM21 to NVM2$n$ are connected to the ways W21 to W2$n$. It may be connected to the second channel CH2. In example embodiments, each of the memory devices NVM11 to NVMmn may be implemented in an arbitrary memory unit capable of operating according to an individual command from the memory controller 20. For example, each of the memory devices NVM11 to NVMmn may be implemented as a chip or die, but the present inventive concepts are not limited thereto.

The memory controller 20 may transmit and receive signals to and from the memory device 10 through a plurality of channels CH1 to CHm. For example, the memory controller 20 stores commands CMDa to CMDm, addresses ADDRa to ADDRm, and data DATAa to DATAm to the memory device 10 through channels CH1 to CHm. The data DATAa to DATAm may be transmitted to the device 10 or may be received from the memory device 10.

The memory controller 20 may select one of the nonvolatile memory devices connected to the corresponding channel through each channel, and transmit and receive signals with the selected nonvolatile memory device. For example, the memory controller 20 may select the nonvolatile memory device NVM11 from among the memory devices NVM11 to NVM1$n$ connected to the first channel CH1. The memory controller 20 may transmit a command CMDa, an address ADDRa, and data DATAa to the selected memory device NVM11 through the first channel CH1, or may receive data DATAa from the selected memory device NVM11.

The memory controller 20 may transmit and receive signals to and from the memory device 10 in parallel through different channels. For example, while the memory controller 20 transmits the command CMDa to the memory device 10 through the first channel CH1, the memory controller 20 may transmit the command CMDb to the memory device 10 through the second channel CH2. For example, the memory controller 20 may receive the data DATAa from the memory device 10 through the first channel CH1 while receiving the data DATAb from the memory device 10 through the second channel CH2.

The memory controller 20 may control the overall operation of the memory device 10. The memory controller 20 may control each of the memory devices NVM11 to NVMmn connected to the channels CH1 to CHm by transmitting signals to the channels CH1 to CHm. For example, the memory controller 20 may control a selected one of the memory devices NVM11 to NVM1$n$ by transmitting the command CMDa and the address ADDRa to the first channel CH1.

Each of the memory devices NVM11 to NVMmn may operate under the control of the memory controller 20. For example, the memory device NVM11 may program the data DATAa according to the command CMDa, the address ADDRa, and the data DATAa provided through the first channel CH1. For example, the memory device NVM21 reads the data DATAb according to the command CMDb and the address ADDRb provided through the second channel CH2 and may transmit the read data DATAb to the memory controller 20.

Although FIG. 1 illustrates that the memory device 10 communicates with the memory controller 20 through m channels and the memory device 10 includes n nonvolatile memory devices corresponding to channels, respectively, the number of channels and the number of nonvolatile memory devices connected to one channel may be variously changed.

Figure 2:
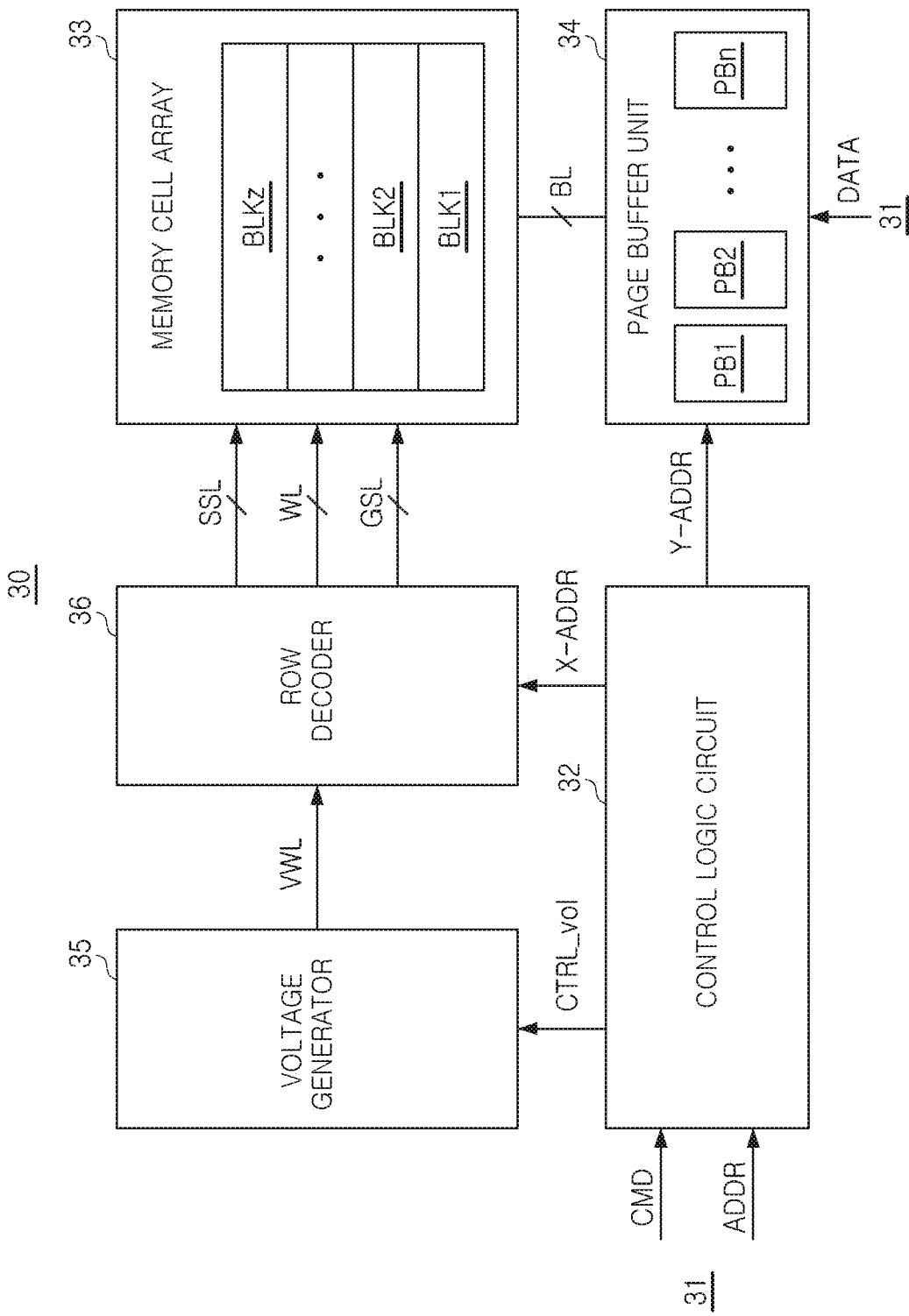
FIG. 2 is a block diagram schematically illustrating a memory device according to example embodiments.

FIG. 2 is a block diagram schematically illustrating a memory device according to example embodiments.

Referring to FIG. 2, a memory device 30 may include a control logic circuit 32, a memory cell array 33, a page buffer unit 34, a voltage generator 35, and/or a row decoder 36. The memory device 30 may further include an interface circuit 31, and may further include a column logic, a pre-decoder, a temperature sensor, a command decoder, an address decoder, and/or a source driver.

The control logic circuit 32 may generally control various operations within the memory device 30. The control logic circuit 32 may output various control signals in response to the command CMD and/or the address ADDR from the interface circuit 31. For example, the control logic circuit 32 may output a voltage control signal CTRL_vol, a row address X-ADDR, and a column address Y-ADDR.

The memory cell array 33 may include a plurality of memory blocks BLK1 to BLKz (z is a positive integer), and each of the plurality of memory blocks BLK1 to BLKz may include a plurality of memory cells. The memory cell array 33 may be connected to the page buffer unit 34 through bit lines BL, and may be connected to the row decoder 36 through word lines WL, string selection lines SSL, and ground selection lines GSL.

In example embodiments, the memory cell array 33 may include a 3D memory cell array, and the 3D memory cell array may include a plurality of NAND strings. Each NAND string may include memory cells connected to word lines vertically stacked on a substrate. U.S. Pat. Nos. 7,679,133, 8,553,466, 8,654,587, 8,559,235, and U.S. Patent Application Publication No. 2011/0233648 are incorporated herein by reference in the form of citation. In example embodiments, the memory cell array 33 may include a 2D memory cell array, and the 2D memory cell array may include a plurality of NAND strings in row and column directions.

The page buffer unit 34 may include a plurality of page buffers PB1 to PBn (where n is an integer of 3 or more), and the plurality of page buffers PB1 to PBn may be connected to the memory cells, respectively, through the plurality of bit lines BL. The page buffer unit 34 may select at least one bit line from among the bit lines BL in response to the column address Y-ADDR. The page buffer unit 34 may operate as a write driver or sense amplifier according to an operation mode. For example, during a programming operation, the page buffer unit 34 may apply a bit line voltage corresponding to data to be programmed to the selected bit line. During a reading operation, the page buffer unit 34 may sense data stored in a memory cell by sensing a current or voltage of a selected bit line.

The voltage generator 35 may generate various types of voltages for performing program, reading and erase operations based on the voltage control signal CTRL_vol. For example, the voltage generator 35 may generate a program voltage, a read voltage, a pass voltage, a program verification voltage, an erase voltage, and/or the like. Some of the voltages generated by the voltage generator 35 may be input to the word lines WL as a word line voltage VWL by the row decoder 36, and some thereof may also be input to the common source line by a source driver.

The row decoder 36 may select one of the plurality of word lines WL in response to the row address X-ADDR, and may select one of the plurality of string selection lines SSL. For example, during a programming operation, the row decoder 360 may apply a program voltage and a program verification voltage to the selected word line, and may apply a read voltage to the selected word line during the reading operation.

Figure 3:
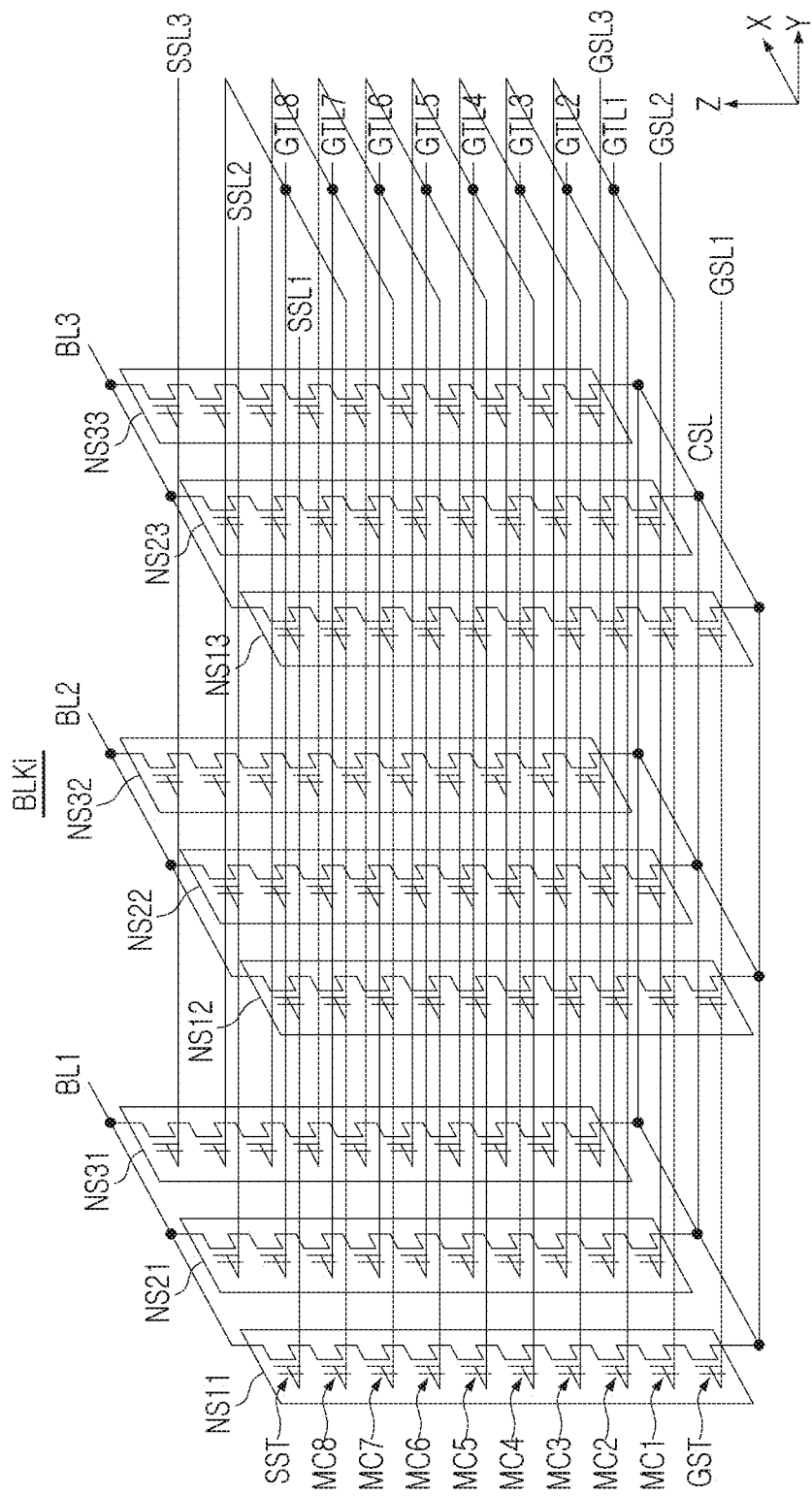
FIG. 3 is a schematic circuit diagram of a memory block of a memory device according to example embodiments.

FIG. 3 is a schematic circuit diagram of a memory block of a memory device according to example embodiments.

The memory block BLKi illustrated in FIG. 3 represents a three-dimensional memory block formed on a substrate in a three-dimensional structure. For example, a plurality of NAND strings included in the memory block BLKi may be formed in a direction, perpendicular to the substrate.

Referring to FIG. 3, the memory block BLKi may include a plurality of NAND strings NS11 to NS33 connected between bit lines BL1, BL2 and BL3 and a common source line CSL. Each of the plurality of NAND strings NS11 to NS33 may include a string selection transistor SST, a plurality of memory cells MC1, MC2, ..., MC8, and/or a ground selection transistor GST. In FIG. 3, each of the plurality of memory NAND strings NS11 to NS33 is illustrated to include eight memory cells MC1, MC2, ..., MC8, but is not limited thereto.

The string selection transistors SST may be connected to the corresponding string selection lines SSL1, SSL2 and SSL3. The plurality of memory cells MC1, MC2, ..., MC8 may be connected to corresponding gate lines GTL1, GTL2, ..., GTL8, respectively. The gate lines GTL1, GTL2, ..., GTL8 may correspond to word lines, and some of the gate lines GTL1, GTL2, ..., GTL8 may correspond to dummy word lines. The ground selection transistors GST may be connected to the corresponding ground selection lines GSL1, GSL2, and GSL3. The string selection transistor SST may be connected to the corresponding bit lines BL1, BL2 and BL3, and the ground selection transistor GST may be connected to the common source line CSL.

Word lines (e.g., WL1) at the same height are connected in common, and ground selection lines GSL1, GSL2, and GSL3 and string selection lines SSL1, SSL2, and SSL3 may be separated from each other, respectively. In FIG. 3, the memory block BLK is illustrated to be connected to eight gate lines GTL1, GTL2, ..., GTL8 and three bit lines BL1, BL2, BL3, but the configuration is not limited thereto.

Figure 4:
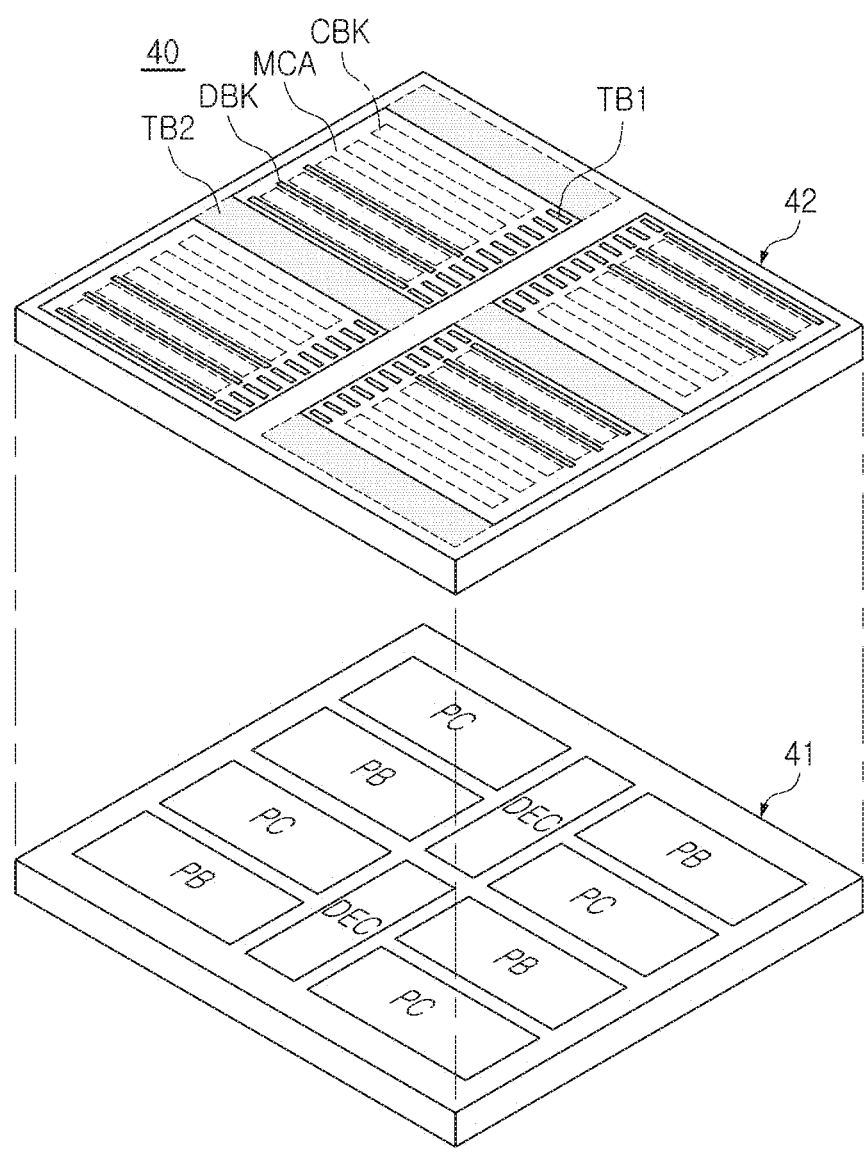
FIG. 4 is a schematic diagram illustrating a structure of a memory device according to example embodiments.

FIG. 4 is a schematic diagram illustrating a structure of a memory device according to example embodiments.

Referring to FIG. 4, a semiconductor device 40 may include a first area 41 and a second area 42 stacked in a first direction (Z-axis direction). The first area 41 is a peripheral circuit area and may include a row decoder DEC, a page buffer PB, and/or a peripheral circuit PC. For example, the peripheral circuit PC may include a charge pump, a voltage generator, a source driver, an interface circuit, and/or the like.

The second area 42 is a cell area and may include memory cell arrays MCA and first and second through-wiring areas TB1 and TB2. In each of the first and second through-wiring areas TB1 and TB2, through-wirings connecting the first area 41 and the second area 42 to each other and extending in the first direction may be disposed. Each of the memory cell arrays MCA may include cell blocks CBK and dummy blocks DBK arranged in a second direction (Y-axis direction).

The dummy blocks DBK may be blocks in which memory cells are not disposed or an operation such as storing data in the memory cells is not executed. For example, the dummy blocks DBK may include a bit line contact block in which bit line contacts are disposed, and a source contact block in which source contacts are disposed. The bit line contacts may be connected to bit lines that are connected to channel structures in the cell blocks CBK, and may extend to the first area 41. The source contacts may be connected to a common source line of the second area 42.

Referring to FIG. 4, at least some of the circuits DEC, PB, and PC disposed in the first area 41 may be disposed below the memory cell arrays MCA of the second area 42. For example, the page buffer PB may disposed below the dummy block DBK in which bit line contacts extending in the first direction while being connected to the bit lines in the memory cell arrays MCA are disposed. In addition, the row decoder DEC may be disposed below the first through-wiring areas TB1 in which word line contacts extending in the first direction while being connected to the word lines are disposed.

In example embodiments, source contacts connected to a common source line may be disposed in the second through-wiring areas TB2, and a source driver may be disposed in the first area 41 below the second through-wiring areas TB2. However, in example embodiments, circuits and arrangement forms included in the first area 41 may be variously changed, and accordingly, circuits disposed overlapping with the memory cell arrays MCA may also be variously changed.

Figure 5:
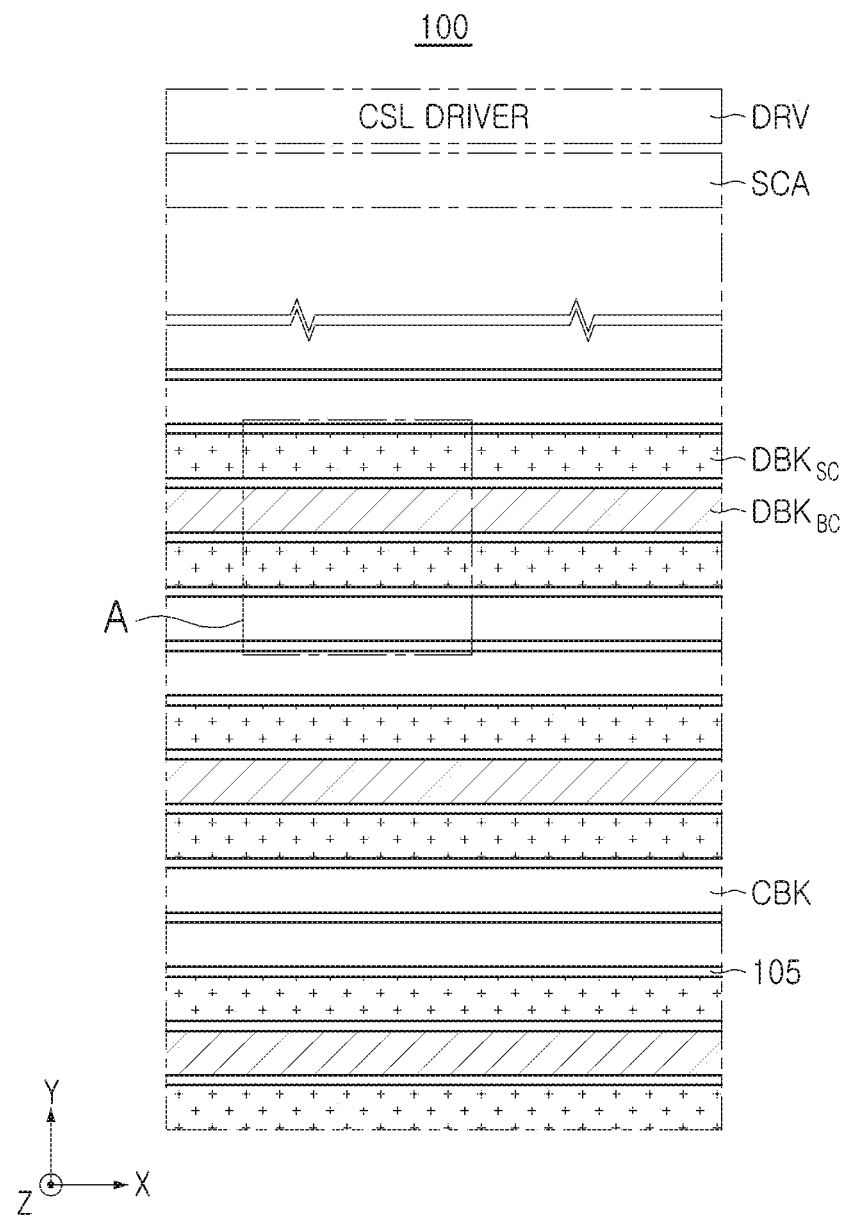
FIGS. 5 and 6 are diagrams illustrating a structure of a memory device according to example embodiments.
Figure 6:
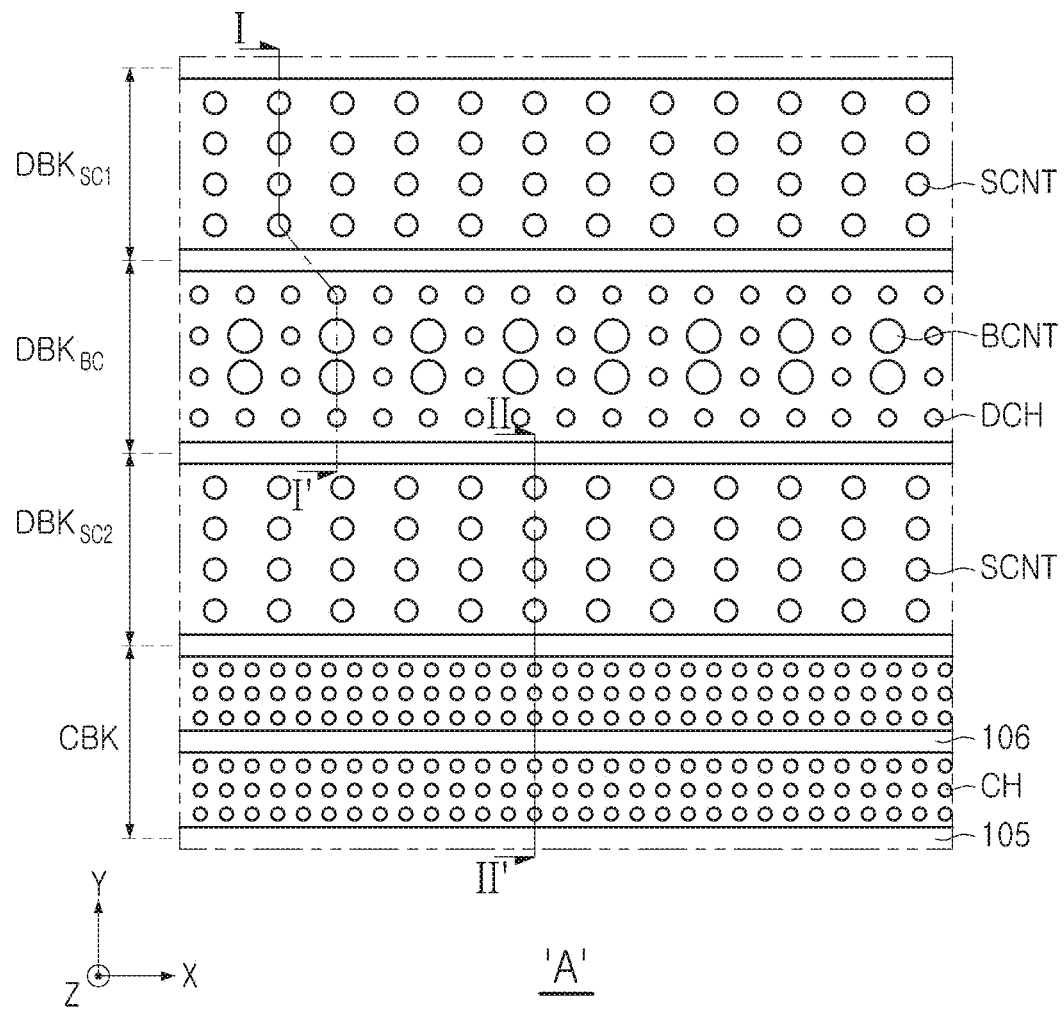

FIGS. 5 and 6 are diagrams illustrating a structure of a memory device according to example embodiments.

FIG. 5 is a plan view illustrating a portion of the memory device 100 according to example embodiments. For example, in example embodiments illustrated in FIG. 5, the memory device 100 may include a peripheral circuit area and a cell area stacked in the first direction (Z-axis direction), and the cell area is stacked on an upper surface of the peripheral circuit area. For example, the peripheral circuit area may include a first substrate and circuit elements formed on the first substrate, and a portion of the circuit elements may provide a source driver DRV. The source driver DRV may be connected to the source region formed on the second substrate of the cell area.

Referring to FIG. 5, the memory device 100 according to example embodiments may include a plurality of cell blocks CBK and a plurality of dummy blocks $DBK_{SC}$ and $DBK_{BC}$ arranged in a second direction (Y-axis direction). The plurality of cell blocks CBK and the plurality of dummy blocks $DBK_{SC}$ and $DBK_{BC}$ may be separated from each other in the second direction by separation layers 105.

Referring to FIGS. 5 and 6 together, each of the plurality of cell blocks CBK may include gate electrode layers and insulating layers alternately stacked in the first direction, and channel structures CH extending in the first direction and penetrating through the gate electrode layers and the insulating layers. Each of the channel structures CH may provide a NAND string, together with the gate electrode layers. Lower portions of the channel structures CH in the first direction may be respectively connected to the second substrate.

The plurality of dummy blocks $DBK_{SC}$ and $DBK_{BC}$ may include source contact blocks $DBK_{SC1}$ and $DBK_{SC2}$ and bit line contact blocks $DBK_{BC}$. The numbers of the source contact blocks $DBK_{SC1}$ and $DBK_{SC2}$ and the bit line contact blocks $DBK_{BC}$ may be respectively variously modified according to example embodiments.

Each of the source contact blocks $DBK_{SC1}$ and $DBK_{SC2}$ may include a first dummy insulating region disposed on the second substrate, and source contacts SCNT extending in the first direction while penetrating through the first dummy insulating region and connected to the second substrate. The source contacts SCNT may be connected to the source driver DRV through dummy bit lines that extend in the second direction and are not connected to the channel structures CH.

The arrangement shape and number of the source contacts SNCT in each of the source contact blocks $DBK_{SC1}$ and $DBK_{SC2}$ are not limited to the illustration in FIG. 6 and may be variously modified. For example, dummy channel structures DCH may also be disposed in the source contact blocks $DBK_{SC1}$ and $DBK_{SC2}$.

The source driver DRV may be connected to the substrate through the second source contacts SCNT formed in each of the source contact blocks $DBK_{SC1}$ and $DBK_{SC2}$ and edge source contacts formed in a source contact area SCA adjacent to the edge of the second substrate. For example, in example embodiments in which the source contact blocks $DBK_{SC1}$ and $DBK_{SC2}$ are not formed, since a voltage is input to the second substrate only through the edge source contacts, a voltage difference may occur depending on the location. In example embodiments of the present inventive concepts, by disposing the source contacts SCNT in the source contact blocks $DBK_{SC1}$ and $DBK_{SC2}$ between the cell blocks CBK, the voltage difference depending on the location may be significantly reduced and the performance of the memory device 100 may be improved.

Referring to FIGS. 5 and 6, the bit line contact block $DBK_{BC}$ may be disposed between the first source contact block $DBK_{SC1}$ and the second source contact block $DBK_{SC2}$ in the second direction. The bit line contact block $DBK_{BC}$ may include a second dummy insulating region disposed on the second substrate, dummy channel structures DCH extending in the first direction within the second dummy insulating region, and bit line contacts BCNT that penetrate through the second dummy insulating region and extend in the first direction. The bit line contacts BCNT are connected to channel structures disposed in the cell blocks CBK through bit lines, and may penetrate through the second dummy insulating region and the second substrate and may extend to the peripheral circuit area. For example, the bit line contacts BCNT are connected to a page buffer in a peripheral circuit area, and a partial area of the second substrate through which the bit line contacts BCNT penetrate may be formed of an insulating material.

Referring to FIG. 6, unlike the dummy blocks $DBK_{SC1}$, $DBK_{SC2}$, and $DBK_{BC}$, an intermediate separation layer 106 may be formed in the cell block CBK. Accordingly, in a sacrificial layer removal process in which an etching solution such as phosphoric acid is introduced into a trench previously formed to form the separation layer 105, the sacrificial layers included in the cell block CBK may be effectively removed. On the other hand, the intermediate separation layer 106 is not formed in the dummy blocks $DBK_{SC1}$, $DBK_{SC2}$, and $DBK_{BC}$, and thus, some of the sacrificial layers may remain without being removed in the sacrificial layer removal process. The first dummy insulating region and the second dummy insulating region may be provided by remaining dummy sacrificial layers and dummy insulating layers that are alternately stacked with the dummy sacrificial layers.

In example embodiments, the first dummy insulating region and the second dummy insulating region may have different structures. For example, the first dummy insulating region may be formed by filling a space formed by removing all of the sacrificial layers and the insulating layers with an insulating material. Accordingly, the number of insulating layers included in the first dummy insulating region may be less than the number of insulating layers included in the second dummy insulating region.

Figure 7:
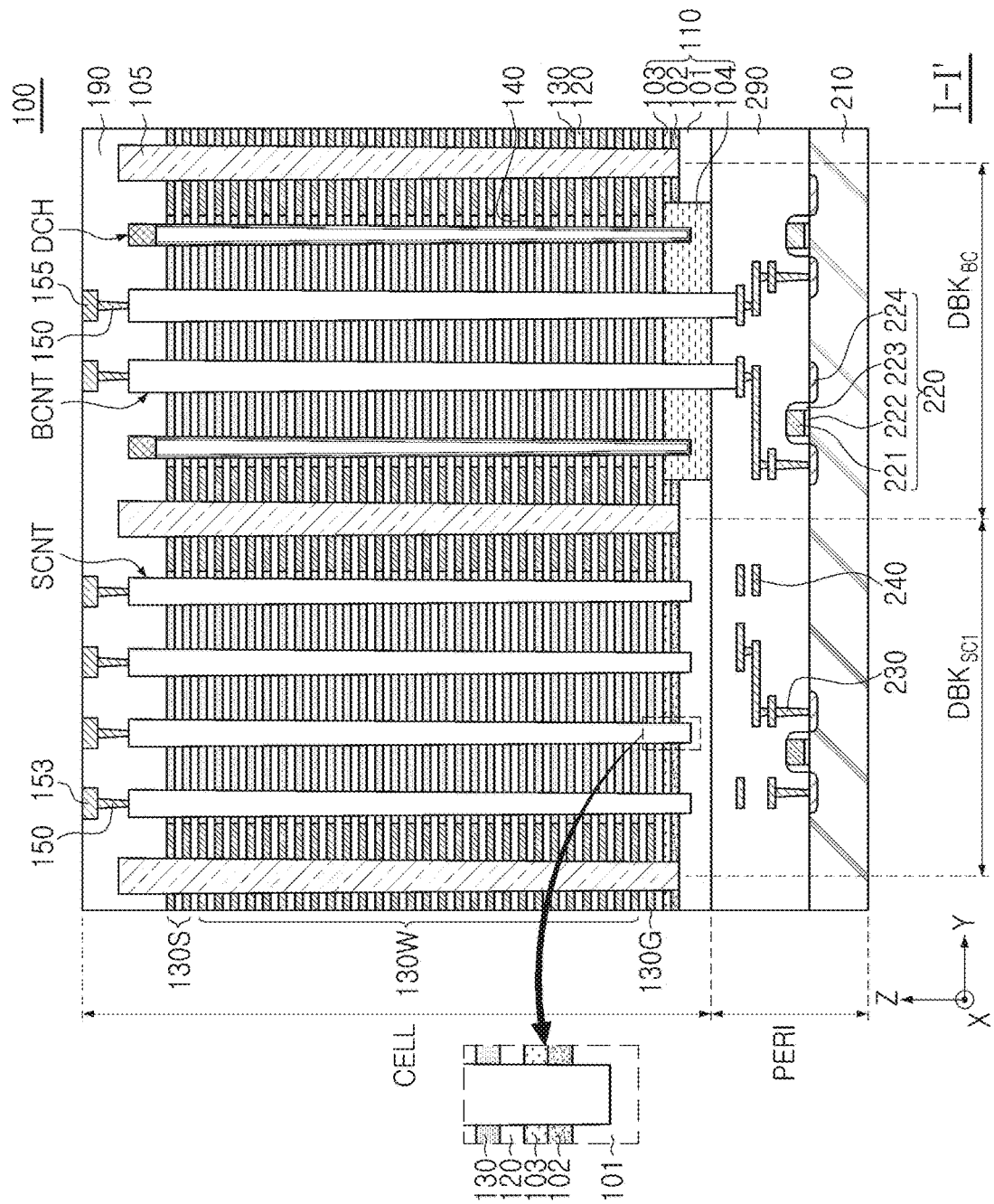
FIGS. 7 and 8 are views illustrating a cross section in the direction I-I' of FIG. 6.
Figure 8:
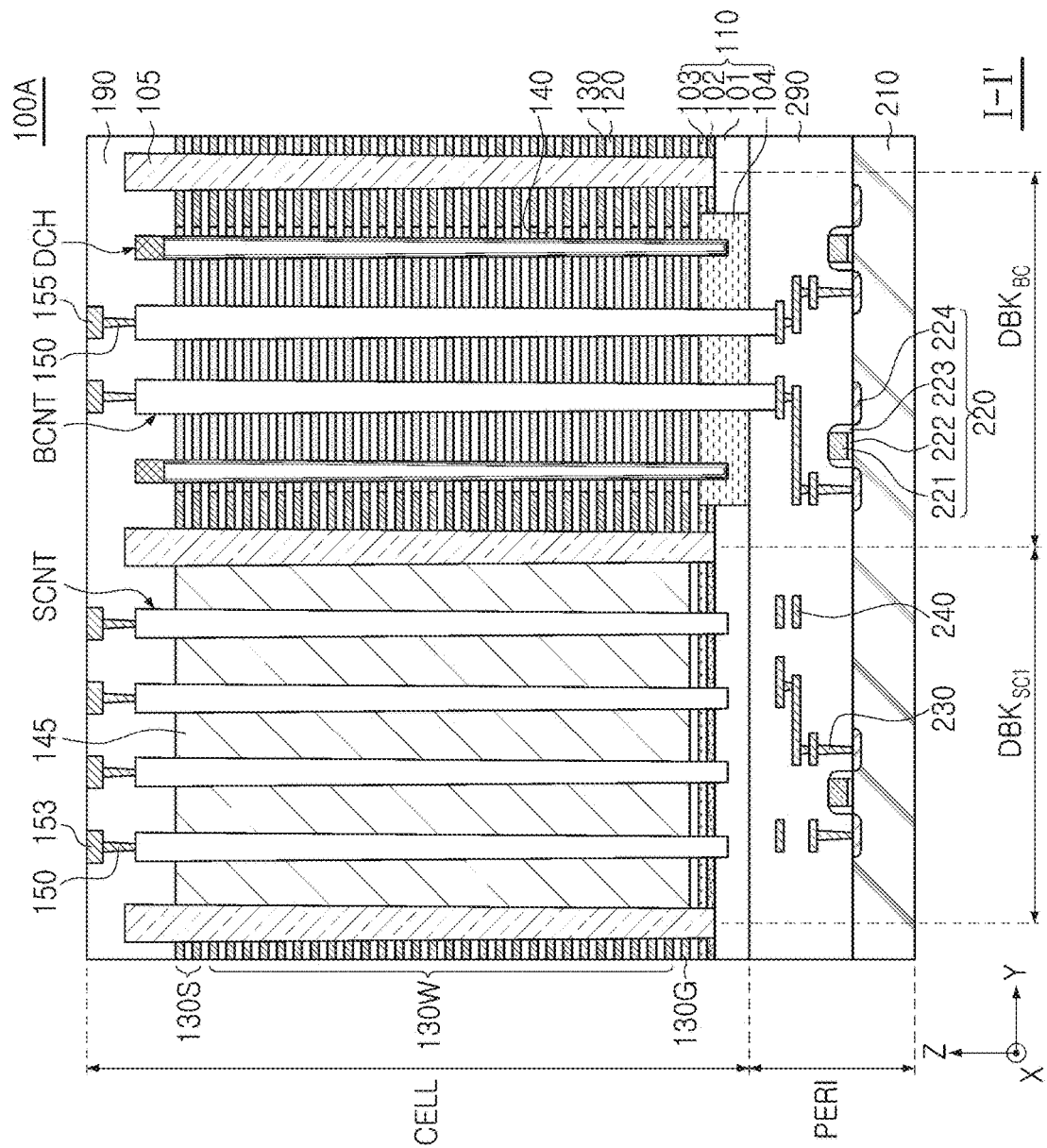
Figure 9:
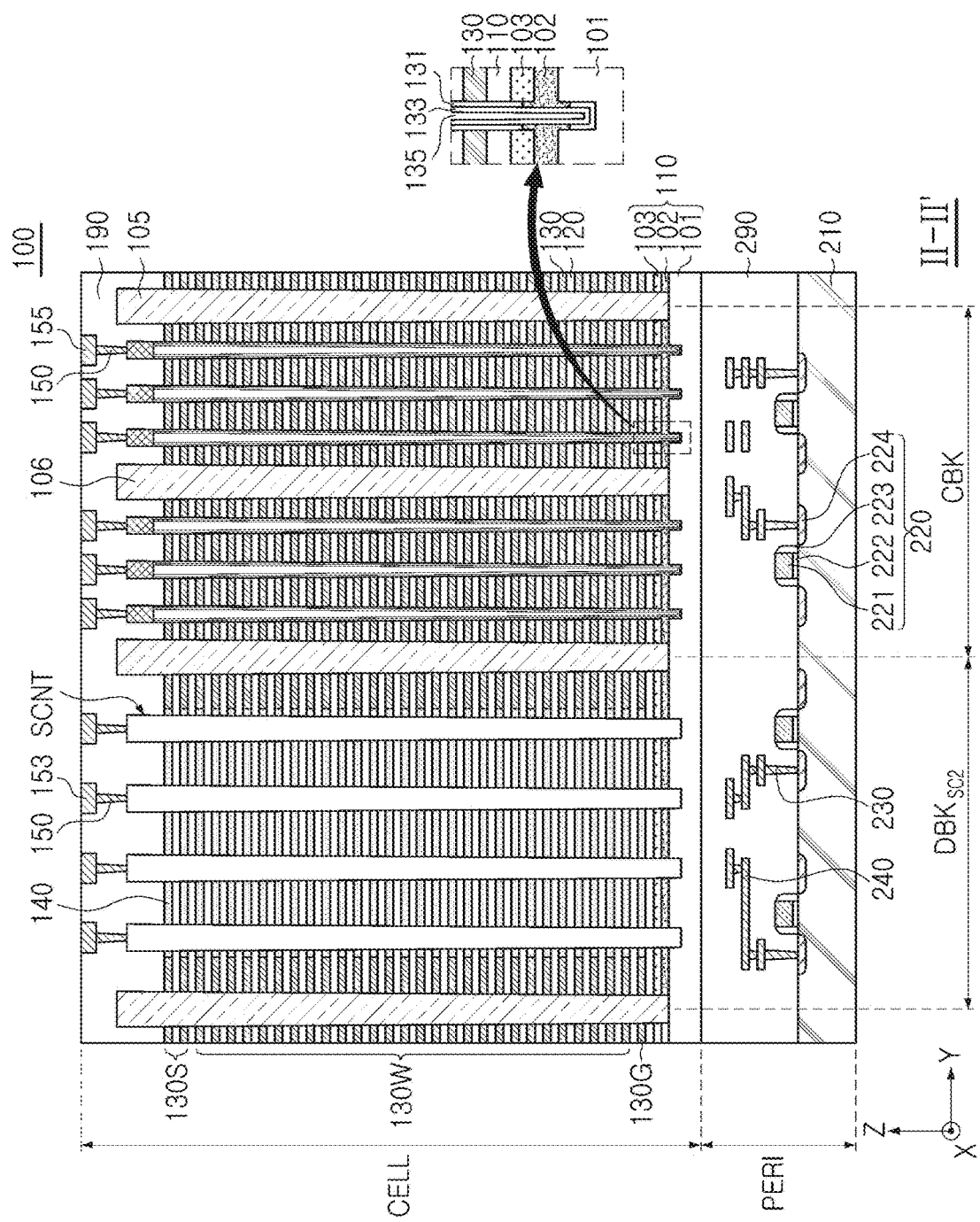
FIG. 9 is a diagram illustrating a cross section in the direction II-II' of FIG. 6.
Figure 10:
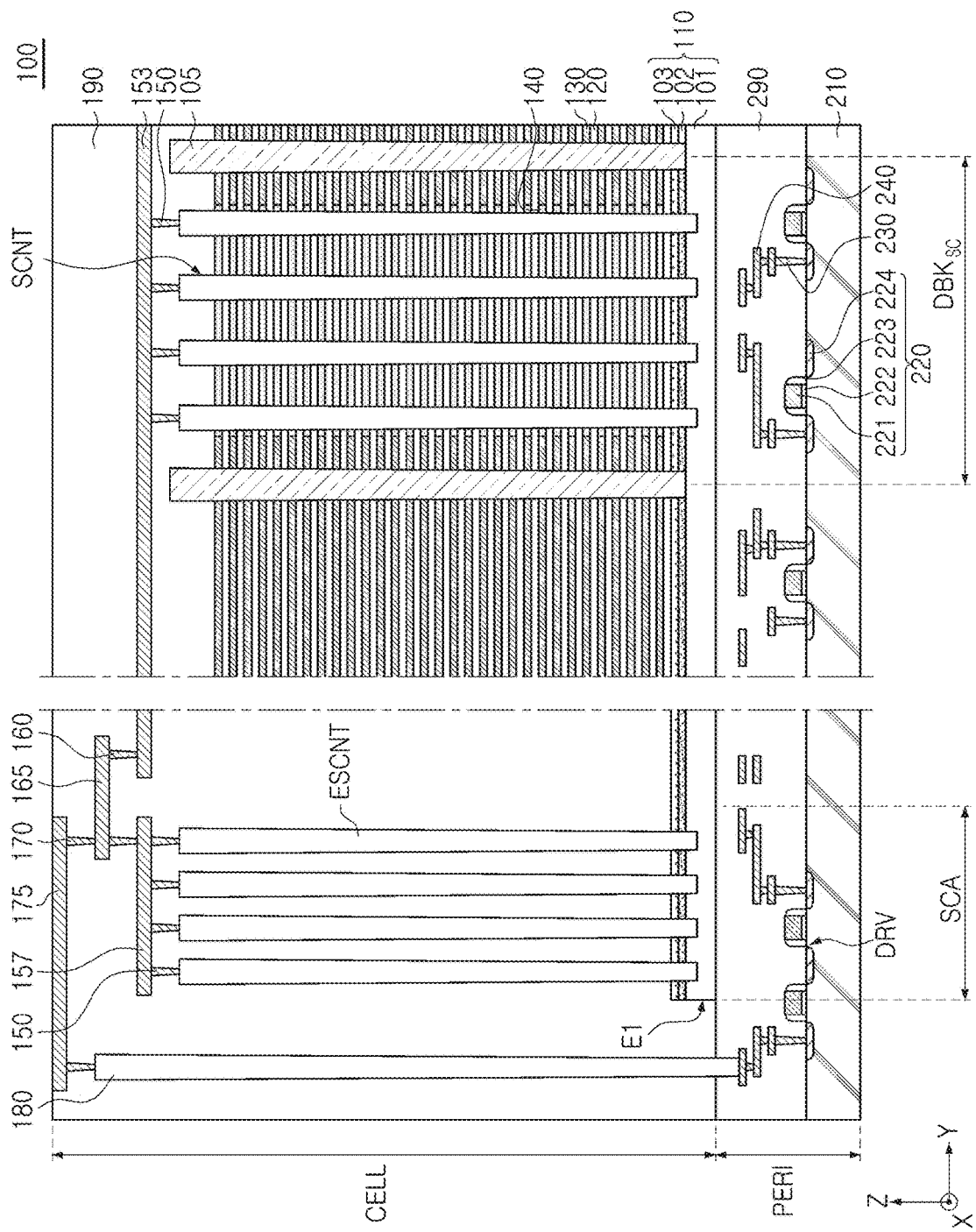
FIG. 10 is a diagram illustrating a cross section around a source contact area of FIG. 6.

FIGS. 7 and 8 are views illustrating a cross section in the direction I-I' of FIG. 6, and FIG. 9 is a view illustrating a cross section in the direction II-II' of FIG. 6. FIG. 10 is a diagram illustrating a cross-section around a source contact area of FIG. 6.

First, referring to FIG. 7, the memory device 100 includes a peripheral circuit area PERI and a cell area CELL, and the peripheral circuit area PERI and the cell area CELL may be stacked with each other in a first direction (Z-axis direction). The peripheral circuit area PERI may include a first substrate 210, circuit elements 220 formed on the first substrate 210, and circuit contacts 230 and/or wiring patterns 240 connected to the circuit elements. The circuit elements 220, the circuit contacts 230, and the wiring patterns 240 may be covered by a peripheral interlayer insulating layer 290. The circuit elements 220 may include a planar transistor, and may include a planar gate electrode 221, a planar gate insulating layer 222, a spacer layer 223, a source/drain region 224, and/or the like.

The cell area CELL may be disposed on the peripheral interlayer insulating layer 290. The cell area CELL may include a second substrate 110, insulating layers 120 and gate electrode layers 130 alternately stacked on the second substrate 110, separation layers 105 dividing the insulating layers 120 and the gate electrode layers 130 into a plurality of blocks $DBK_{SC1}$ and $DBK_{BC}$, an inter-cell insulating layer 190, and/or the like. As described above, the plurality of blocks $DBK_{SC1}$ and $DBK_{BC}$ may be arranged in the second direction (Y-axis direction). The separation layers 105 may extend in the first direction and a third direction (X-axis direction), and may be formed of an insulating material.

The second substrate 110 may include a plurality of layers 101 to 104. The first to third layers 101 to 103 may be formed of a semiconductor material. For example, the first layer 101 may include a group IV semiconductor, a group III-V compound semiconductor, or a group II-VI compound semiconductor. For example, the group IV semiconductor may include silicon, germanium, or silicon-germanium.

The second layer 102 and the third layer 103 may be sequentially stacked on the first layer 101. The second layer 102 is formed of a semiconductor material such as polysilicon, and is doped with impurities to function as a source region. When the third layer 103 is formed of a semiconductor material, the third layer 103 may be doped with impurities of the same conductivity type as the second layer 102 or may include impurities diffused from the second layer 102. However, according to example embodiments, the third layer 103 may also be formed of an insulating material.

The gate electrode layers 130 may include a ground selection line 130G, word lines 130W, and string selection lines 130S. As described above with reference to FIG. 6, the intermediate insulating layer 106 may not be formed on the first source contact block $DBK_{SC1}$ and the bit line contact block $DBK_{BC}$. Therefore, as illustrated in FIG. 7, the gate electrode layers 130 are not formed in the first source contact block $DBK_{SC1}$ and the bit line contact block $DBK_{BC}$, and the sacrificial layers may remain therein, thereby forming a dummy sacrificial layer 140. The sacrificial layers 140 may provide a first dummy insulating region and a second dummy insulating region, together with the insulating layers 120.

The source contacts SCNT may penetrate through the first dummy insulating region and connected to the second substrate 110. For example, the source contacts SCNT may extend to the first layer 101 and may contact the first to third layers 101 to 103 on the side surface thereof. In addition, upper portions of the source contacts SCNT in the first direction may be connected to lower metal wirings 153 through upper contacts 150. The lower metal wirings 153 are connected to the source driver DRV, and a voltage output from the source driver DRV may be transmitted to the second substrate 110. The lower metal wirings 153 connected to the source contacts SCNT may be dummy bit lines.

The bit line contacts BCNT may be formed in the bit line contact block $DBK_{BC}$. The bit line contacts BCNT may extend in the first direction to penetrate through the second dummy insulating region, and may extend to the peripheral circuit area PERI. The bit line contacts BCNT may be connected to the page buffer of the peripheral circuit area PERI. To reduce or prevent the bit line contacts BCNT from being electrically connected to the first to third layers 101 to 103 of the second substrate 110, the bit line contacts BCNT may penetrate through an insulating region 104 of the second substrate 110. The bit line contacts BCNT may be connected to the bit lines 155 through the upper contacts 150.

In the memory device 100A according to example embodiments illustrated in FIG. 8, the first dummy insulating region and the second dummy insulating region may have different structures. Referring to FIG. 8, a first dummy insulating region included in the first source contact block $DBK_{SC1}$ may include a dummy insulating layer 145. The dummy insulating layer 145 may be formed by filling a space from which insulating layers 120, gate electrode layers 130, and sacrificial layers 140 have been removed, with an insulating material, between a pair of separation layers 105 adjacent to the first source contact block $DBK_{SC1}$.

Example embodiments illustrated in FIG. 8 illustrate that the first source contact block $DBK_{SC1}$ includes one dummy insulating layer 145, but the number of dummy insulating layers 145 may be changed according to example embodiments. The number of dummy insulating layers 145 included in the first source contact block $DBK_{SC1}$ may be less than the number of sacrificial layers 140 and insulating layers 120 included in the bit line contact block $DBK_{BC}$.

Next, referring to FIG. 9, the second source contact block $DBK_{SC2}$ may be adjacent to the cell block CBK in the third direction. The second source contact block $DBK_{SC2}$ may have a structure similar to the first source contact block $DBK_{SC1}$ previously described with reference to FIGS. 7 and 8. The second source contact block $DBK_{SC2}$ may be adjacent to the cell block CBK in the third direction.

The cell block CBK may include insulating layers 120 and gate electrode layers 130 alternately stacked on the second substrate 110 in the first direction. As described above, the gate electrode layers 130 may provide word lines 130W, string selection lines 120S, and ground selection lines 120G. The word lines 130W may form memory cells together with the channel structures CH. An intermediate separation layer 106 may be formed in the cell block CBK such that all the sacrificial layers 140 are removed from the cell block CBK and may be replaced with the gate electrode layers 130.

The channel structures CH may respectively extend to the second substrate 110 in the first direction and may be connected to the second substrate 110. Referring to FIG. 9, each of the channel structures CH may include a gate insulating layer 131, a channel layer 133 and/or a buried insulating layer 135, and a side surface of the channel layer 133 may be in contact with the second layer 102 in the second substrate 110. An upper portion of the channel layer 133 may be connected to at least one of the bit lines 155 through a channel pad 137 and the upper contact 150. In example embodiments, the channel pad 137 may be formed of polysilicon doped with impurities.

FIG. 10 is a diagram illustrating a periphery of the source contact area SCA of the memory device 100. Hereinafter, example embodiments of a structure in which the source contacts SCNT are connected to the source driver DRV of the peripheral circuit area PERI will be described with reference to FIG. 10. Referring to FIG. 10, upper portions of the source contacts SCNT may be connected to the lower metal wiring 153 through the upper contacts 150. As described above, the lower metal wiring 153 may be a dummy bit line and may extend in the second direction.

On the other hand, the second substrate 110 includes a first edge E1 extending in the third direction, and in the cell area CELL, edge source contacts ESCNT may be formed adjacent to the first edge E1 and connected to the second substrate 110. The edge source contacts ESCNT may extend in the first direction and may be connected to the second substrate 110. In addition, upper portions of the edge source contacts ESCNT may be connected to the lower metal wiring 157 through the upper contact 150. For example, the lower metal wirings 153 and 157 may be disposed at a first height in the first direction.

The lower metal wirings 153 and 157 may be connected to upper metal wirings 165 and 175 through the first wiring contact 160. The upper metal wirings 165 and 175 may be disposed in a position higher than the first height in the first direction, and the upper metal wirings 165 and 175 may be connected to at least one of the wiring patterns 240 of the peripheral circuit area PERI through a through wiring 180.

The through-wiring 180 may cross a boundary between the cell area CELL and the peripheral circuit area PERI and extend in the first direction. Further, the through-wiring 180 is disposed in an inter-cell insulating layer 190 and a peripheral interlayer insulating layer 290, and may be separated from the second substrate 110. Referring to FIG. 10, the through-wiring 180 may be separated from the first edge E1 of the second substrate 110 in the second direction.

In example embodiments illustrated in FIG. 10, the upper metal wirings 165 and 175 may include a first upper metal wiring 165 and a second upper metal wiring 175 connected to each other by a second wiring contact 170. In addition, the first upper metal wiring 165 may be disposed at a second height higher than the first height, and the second upper metal wiring 175 may be disposed at a third height higher than the second height. As illustrated in FIG. 10, the third metal wiring 175 may cross the first edge E1 of the second substrate 110 in the second direction and may be connected to the through-wiring 180. However, depending on example embodiments, the through-wiring 180 may be directly connected to the second metal wiring 165 without the third metal wiring 175. In some example embodiments, the second metal wiring 165 connected to the through wiring 180 may extend in the second direction to traverse the first edge E1.

During a programming operation, a reading operation, an erase operation, and a verification operation of the memory device 100, the source driver DRV may input a predetermined or alternatively, desired bias voltage to the second substrate 110. For example, in a reading operation, the source driver DRV may input a reference voltage, for example, a ground voltage to the second substrate 110, and in the erase operation, the source driver DRV may input an erase voltage to the second substrate 110.

In example embodiments, the source contacts SCNT may be disposed in the source contact block $DBK_{SC}$ among dummy blocks that are included in the memory device 100 and disposed between the cell blocks CBK in the second direction, and the source contacts SCNT may be connected to the source driver DRV through a dummy bit line. Accordingly, the voltage output from the source driver DRV during the operation of the memory device 100 is input to the substrate 110 through the source contacts SCNT disposed between the cell blocks CBK, as well as through the edge source contacts ESCNT, thereby significantly reducing a difference in source voltage according to a location and improving performance of the memory device 100. Hereinafter, this will be described in more detail with reference to FIGS. 11A and 11B.

Figure 11A:
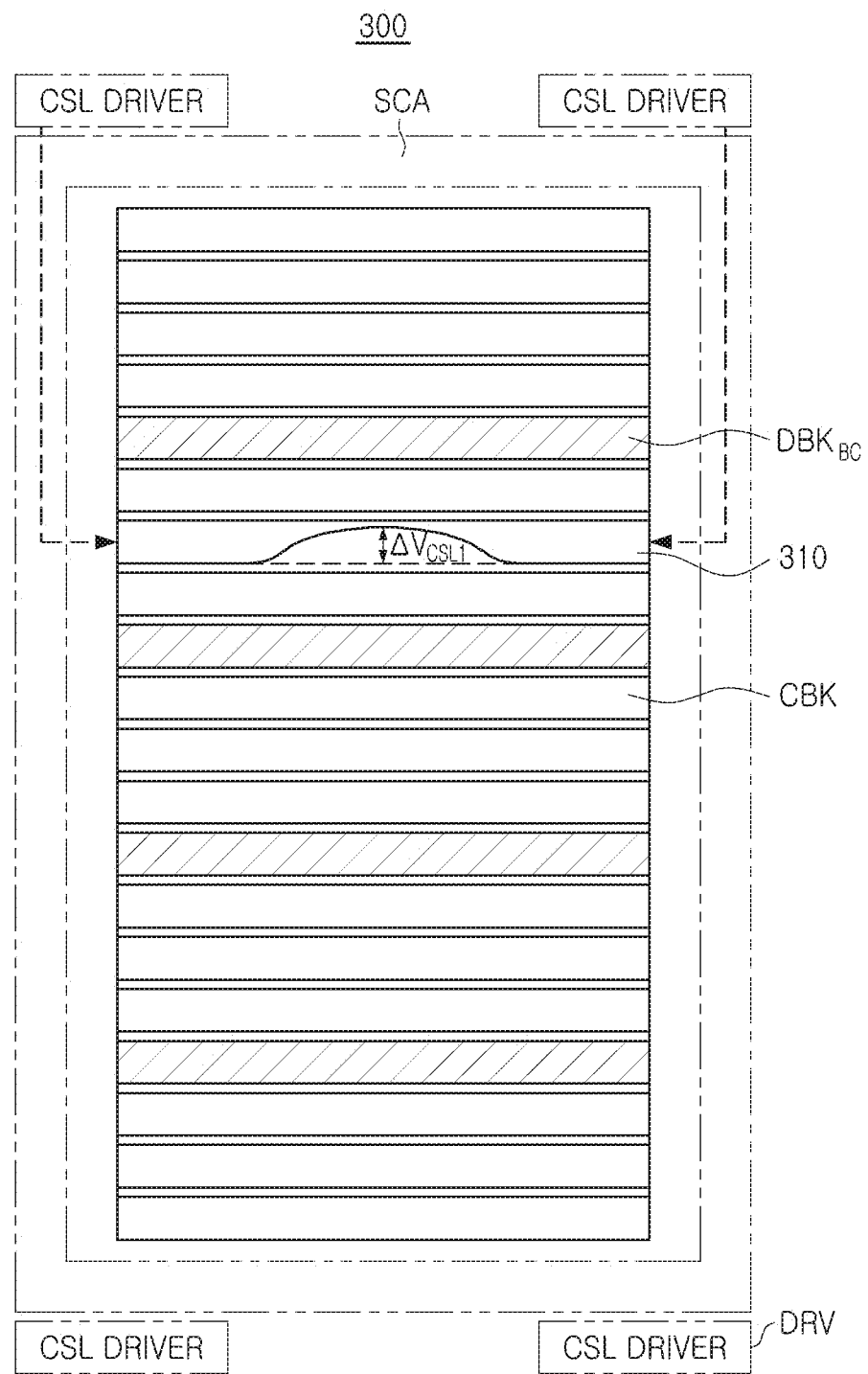
FIG. 11A is a comparative example and FIG. 11B describes an operation of a memory device according to example embodiments.
Figure 11B:
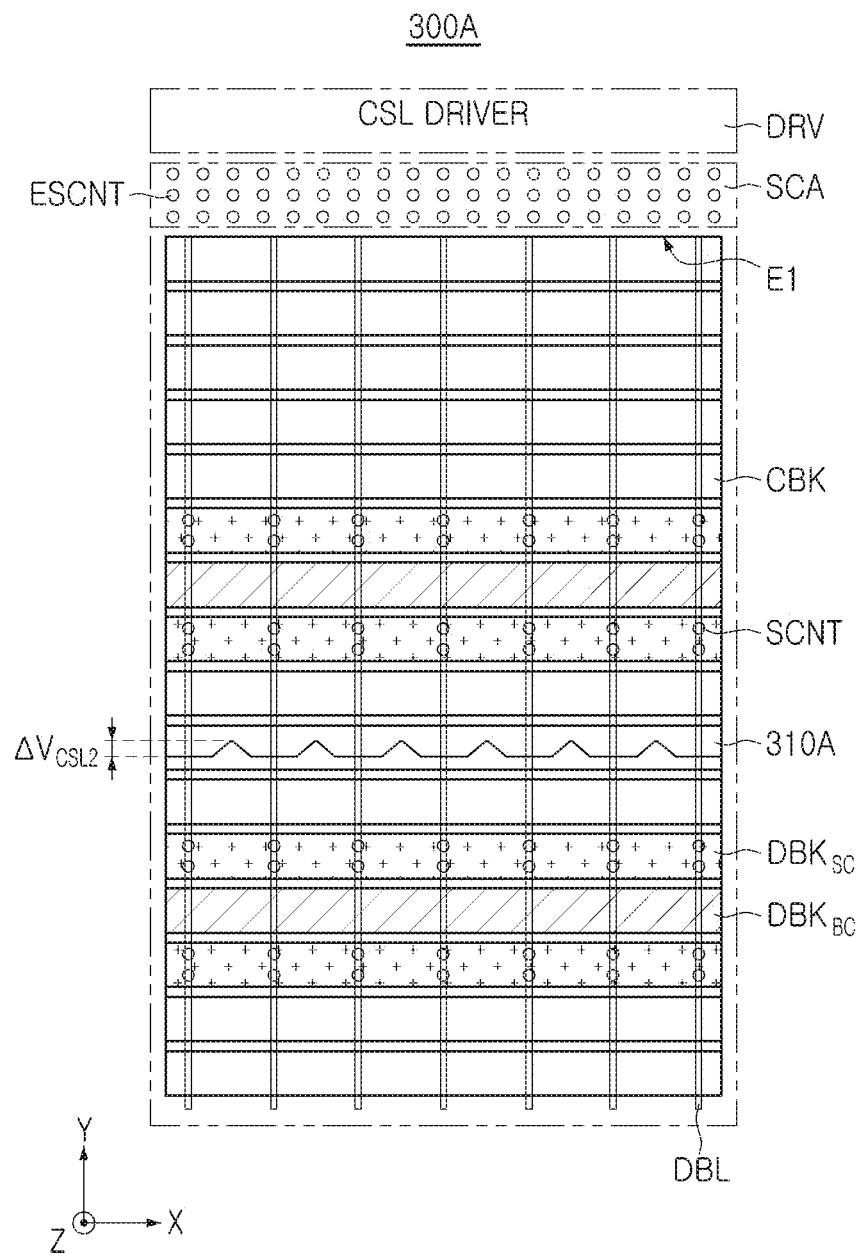

FIGS. 11A and 11B are diagrams illustrating an operation of a memory device according to example embodiments.

First, FIG. 11A is a diagram illustrating a comparative example to describe the operation of a memory device according to example embodiments. Referring to FIG. 11A, in a memory device 300 according to the comparative example, source contacts may be disposed only in the source contact area SCA surrounding the cell blocks CBK and the dummy blocks $DBK_{SC}$. The source contact area SCA is defined along the edges of the substrate of the cell area in which the cell blocks CBK and the dummy blocks $DBK_{BC}$ are formed, and the source drivers DRV may be disposed adjacent to the edges of the substrate of the cell area.

In an example, when a reading operation is performed on a selection block 310 among the cell blocks CBK of the memory device 300, the ground voltage output from at least one of the source drivers DRV may be input to a substrate in the cell area through source contacts. In the comparative example illustrated in FIG. 11A, since the source contacts are disposed only at the edges of the substrate in the cell area, the source voltage may have a first voltage difference $\Delta V_{CSL1}$ according to a position within the selection block 310.

FIG. 11B is a diagram illustrating an operation of a memory device according to example embodiments of the present inventive concepts. Referring to FIG. 11B, in a memory device 300A, source contacts SCNT are disposed in source contact blocks $DBK_{SC}$ among dummy blocks $DBK_{SC}$ and $DBK_{BC}$, and may be connected to dummy bit lines DBL. On the other hand, the source contact area SCA may be defined adjacent to the first edge E1 of the substrate in the cell area, and edge source contacts ESCNT may be disposed in the source contact area SCA. The source contacts SCNT and the edge source contacts ESCNT may be connected to the source driver DRV.

In a reading operation of a selection block 310A of the memory device 300A, the source driver DRV may output a ground voltage. The ground voltage output from the source driver DRV may be input to the substrate in the cell area through the edge source contacts ESCNT and the source contacts SCNT. In example embodiments illustrated in FIG. 11B, since the ground voltage is also transmitted through the source contacts SCNT connected to the dummy bit lines DBL, the difference in the source voltage according to the position in the selection block CBK may be a second voltage difference $\Delta V_{CSL2}$ less than the voltage difference $\Delta V_{CSL1}$. Accordingly, the performance and reliability of the memory device 300A may be improved.

Figure 12:
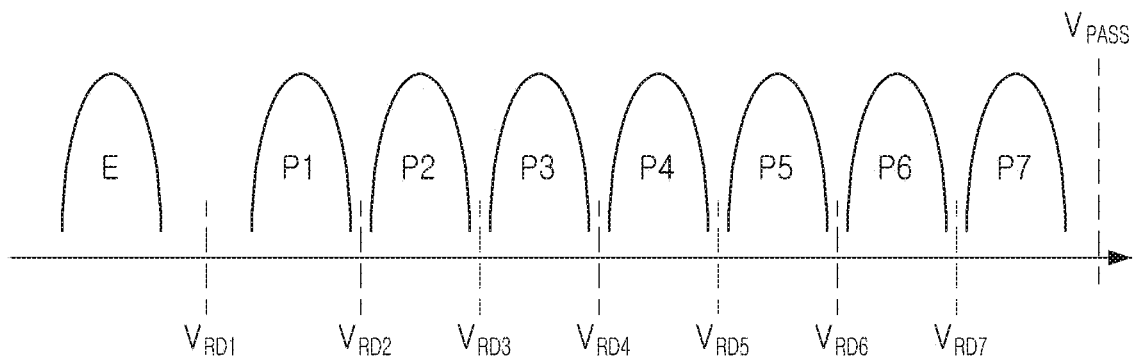
FIGS. 12 and 13 are diagrams illustrating an operation of a memory device according to example embodiments.
Figure 13:
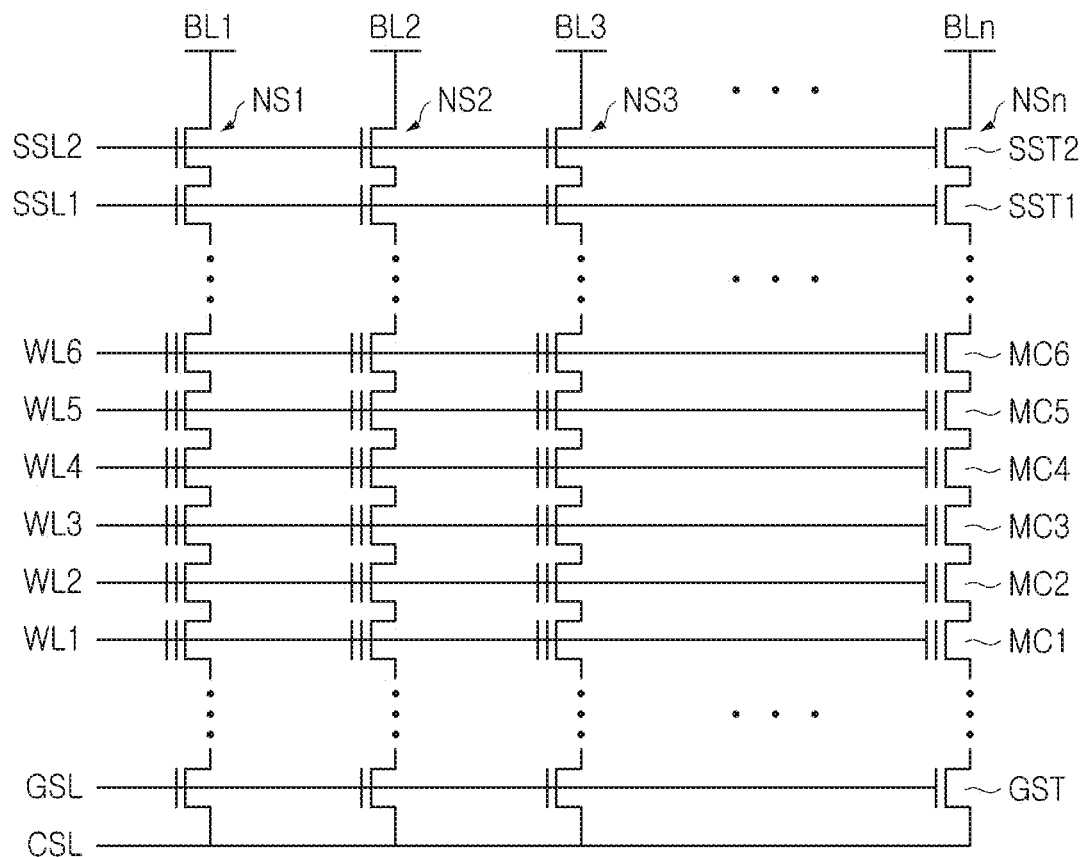

FIGS. 12 and 13 are diagrams illustrating an operation of a memory device according to example embodiments.

FIG. 12 is a diagram schematically illustrating a distribution of threshold voltages that memory cells included in a memory device may have. The memory cells may have one of an erase state E and a program states P1 to P7, and each of the memory cells may store 3 bits of data in example embodiments illustrated in FIG. 12.

When a reading operation is executed in the memory device, a pass voltage $V_{PASS}$ may be input to unselected word lines connected to unselected memory cells. The pass voltage $V_{PASS}$ is a voltage capable of turning on the memory cell regardless of data written to the memory cell, and may be greater than a maximum threshold voltage of a seventh program state having a greatest threshold voltage. On the other hand, one of read voltages VRD1 to VRD7 may be input to a selected word line connected to a selected memory cell. Depending on the read voltages VRD1 to VRD7 input to the selected word line, the selected memory cell may be turned on or turned off, and the page buffer may detect a current or voltage to read data. Hereinafter, the reading operation will be described in more detail with reference to FIG. 13.

Referring to FIG. 13, a memory device includes a plurality of NAND strings, and NAND strings NS1-NSn may be connected between bit lines BL1-BLn and a common source line CSL. Each of the NAND strings NS1 to NSn may include string selection transistors SST1 and SST2, memory cells MC1 to MC6, and a ground selection transistor GST.

For example, when a reading operation for reading data stored in sixth memory cells MC6 is executed, the pass voltage $V_{PASS}$ is input to the first to fifth word lines WL1-WL5, and one of the read voltages $V_{RD1}$ to $V_{RD7}$ may be input to a sixth word line WL6. Two or more of the read voltages $V_{RD1}$ to $V_{RD7}$ may also be sequentially input to the sixth word line WL6 depending on data stored in the sixth memory cells MC6.

A predetermined or alternatively, desired bias voltage may be applied to the string selection lines SSL1 and SSL2 and the ground selection line GSL such that the string selection transistors SST1 and SST2 and the ground selection transistor GST are turned on while the reading operation is executed. On the other hand, a ground voltage is input to the common source line CSL, and the common source line may receive a ground voltage output from the source driver, through source contacts.

The NAND strings NS1-NSn may be arranged in directions parallel to the upper surface of the substrate in the cell area within the cell block. Therefore, when the voltage difference between the common source line CSL is relatively great depending on the position in the cell block, accurate data may not be read from at least some of the sixth memory cells MC6 among the NAND strings NS1-NSn. In example embodiments of the present inventive concepts, by disposing source contacts in at least one of dummy blocks between cell blocks and connecting the source contacts to a source driver, a transmission path of a voltage input to the common source line CSL may be effectively secured. Accordingly, a voltage difference between the common source line CSL depending on the location may be reduced, and performance of the memory device may be improved.

Figure 14:
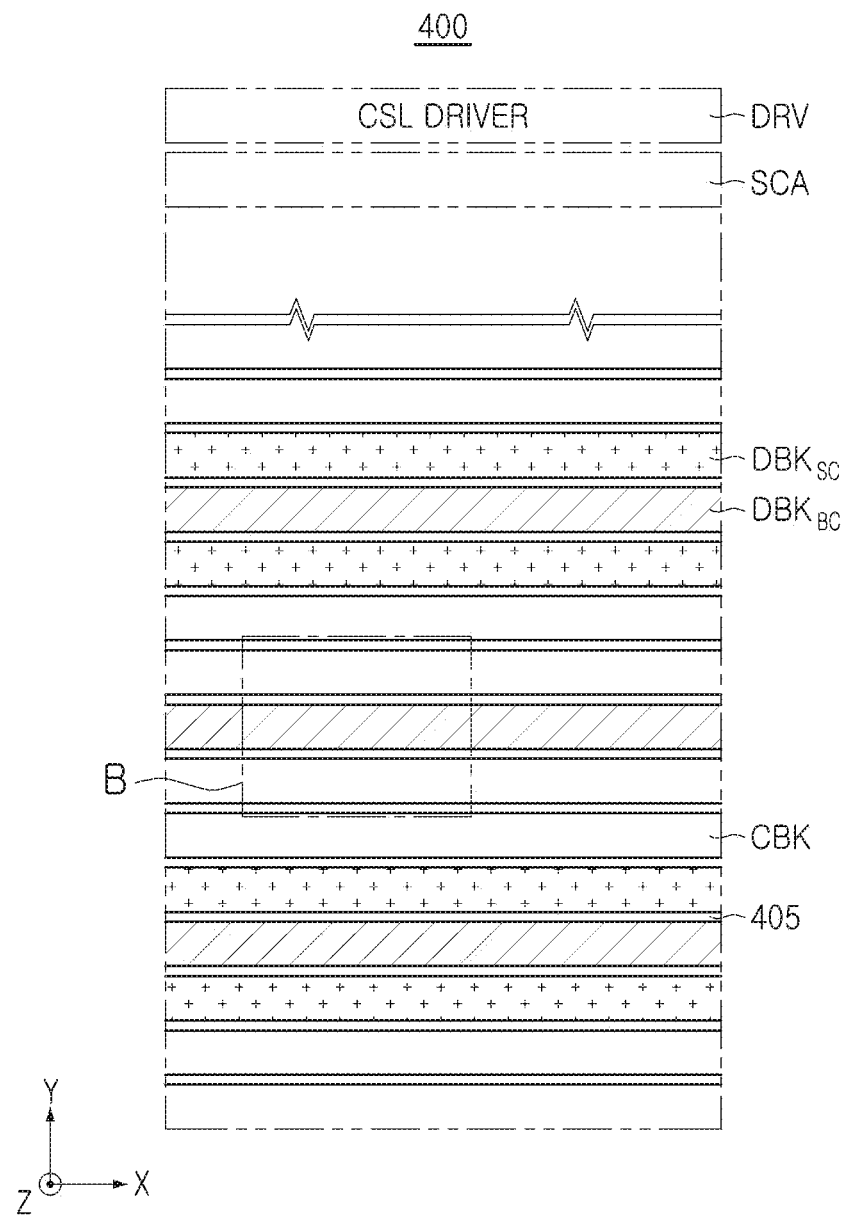
FIGS. 14 and 15 are diagrams to describe a structure of a memory device according to example embodiments.
Figure 15:
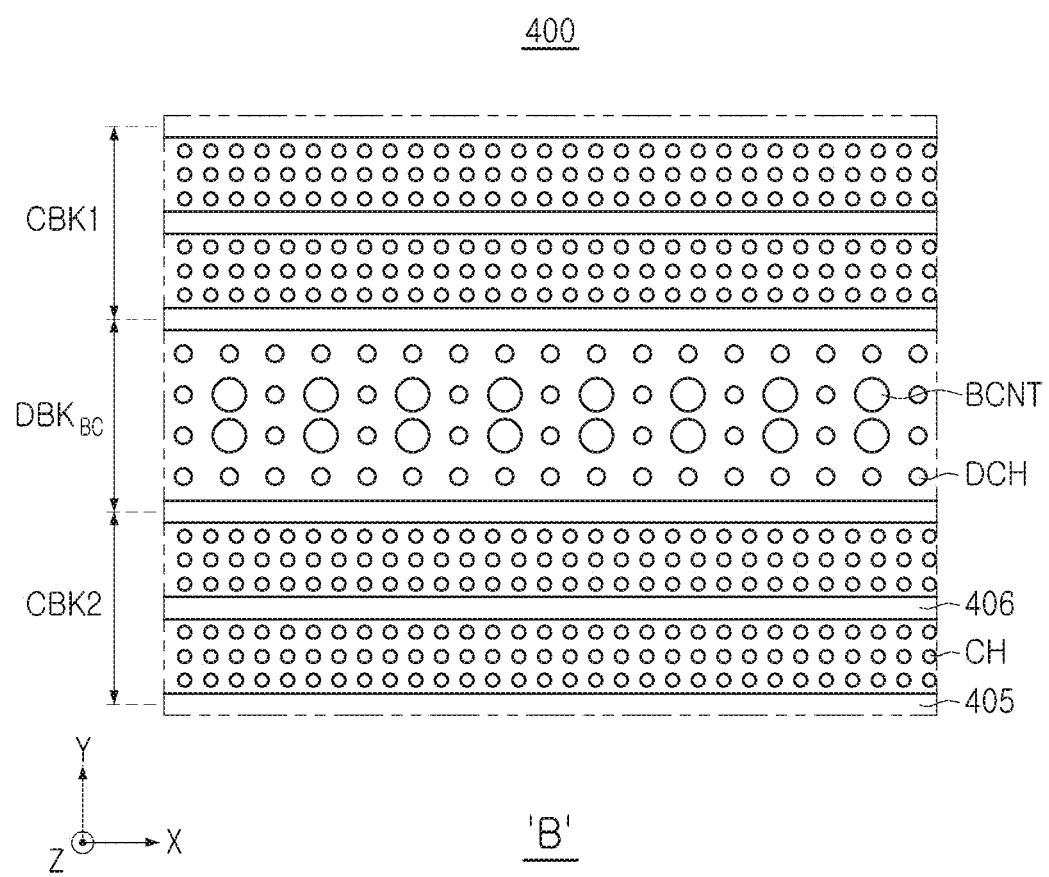

FIGS. 14 and 15 are diagrams to describe the structure of a memory device according to example embodiments.

FIG. 14 is a plan view illustrating a portion of a memory device 400 according to example embodiments. Referring to FIG. 14, the memory device 400 includes a peripheral circuit area and a cell area stacked in a first direction (Z-axis direction), and the cell area may be stacked on the peripheral circuit area. For example, the peripheral circuit area may include a source driver DRV connected to a source region formed on a substrate of the cell area. The source region formed on the substrate of the cell area may function as a common source line.

Referring to FIG. 14, the memory device 400 according to example embodiments may include a plurality of cell blocks CBK and a plurality of dummy blocks $DBK_{SC}$ and $DBK_{BC}$ arranged in a second direction (Y-axis direction). The plurality of cell blocks CBK and the plurality of dummy blocks $DBK_{SC}$ and $DBK_{BC}$ may be separated from each other in the second direction by the separation layers 405, and the plurality of dummy blocks $DBK_{SC}$ and $DBK_{BC}$ may include source contact blocks $DBK_{SC}$ and bit line contact blocks $DBK_{BC}$.

The respective configurations of the cell blocks CBK, the source contact blocks $DBK_{SC}$, and the bit line contact blocks $DBK_{BC}$ may be similar to those described above with reference to FIGS. 7 to 10. However, in example embodiments illustrated in FIG. 14, at least one bit line contact block $DBK_{BC}$ may be adjacent to the cell blocks CBK in the second direction. Referring to FIG. 14, a portion of the bit line contact blocks $DBK_{BC}$ may be disposed between the source contact blocks $DBK_{SC}$ in the second direction, and at least one of the bit line contact blocks $DBK_{BC}$ may be disposed between the cell blocks CBK in the second direction.

Referring to FIG. 15 illustrating an enlarged region B of FIG. 14, at least one bit line contact block $DBK_{BC}$ may be disposed between a first cell block CBK1 and a second cell block CBK2 in the second direction. For example, at least one bit line contact block $DBK_{BC}$ may not be adjacent to other dummy blocks such as the source contact blocks $DBK_{SC}$ and/or the like in the second direction, and may only be adjacent to cell blocks CBK1 and CBK2.

Figure 16:
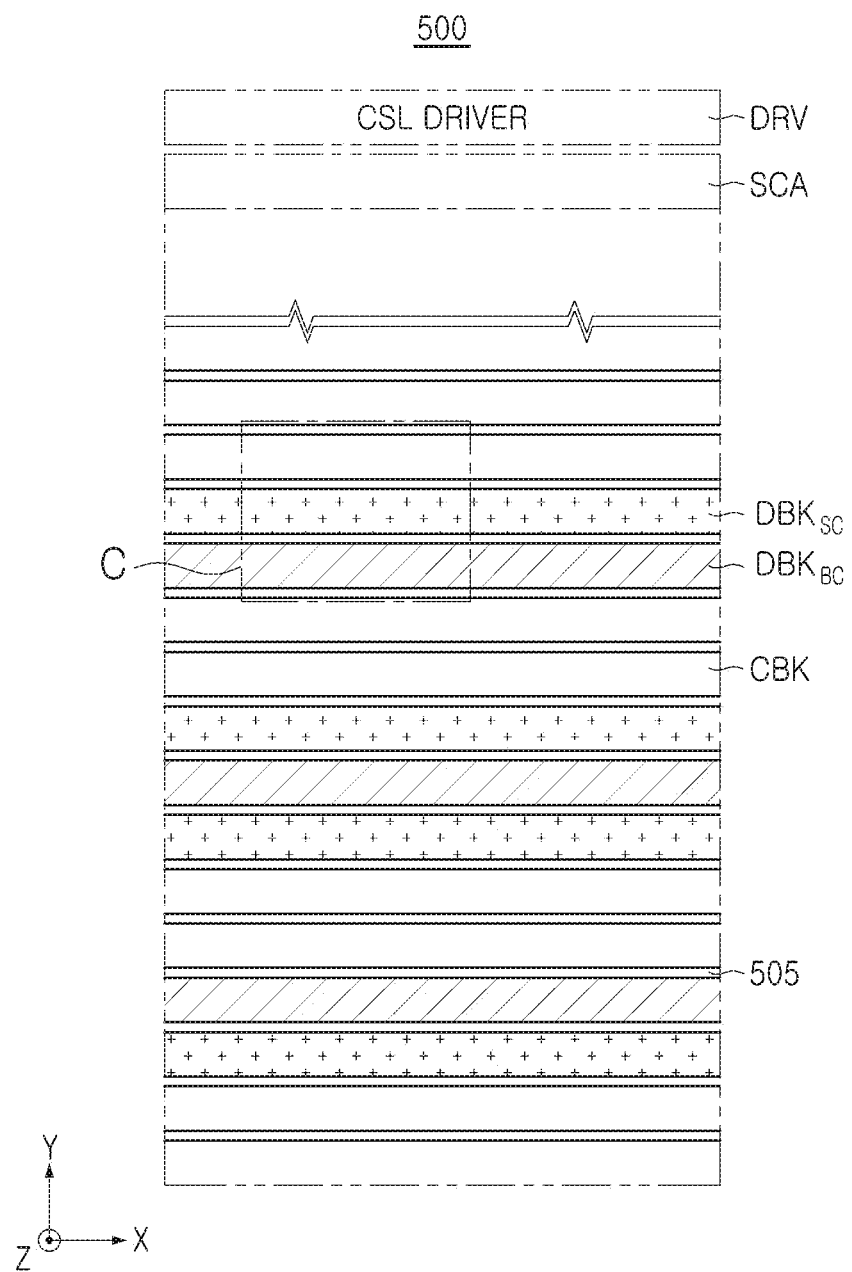
FIGS. 16 and 17 are diagrams illustrating a structure of a memory device according to example embodiments.
Figure 17:
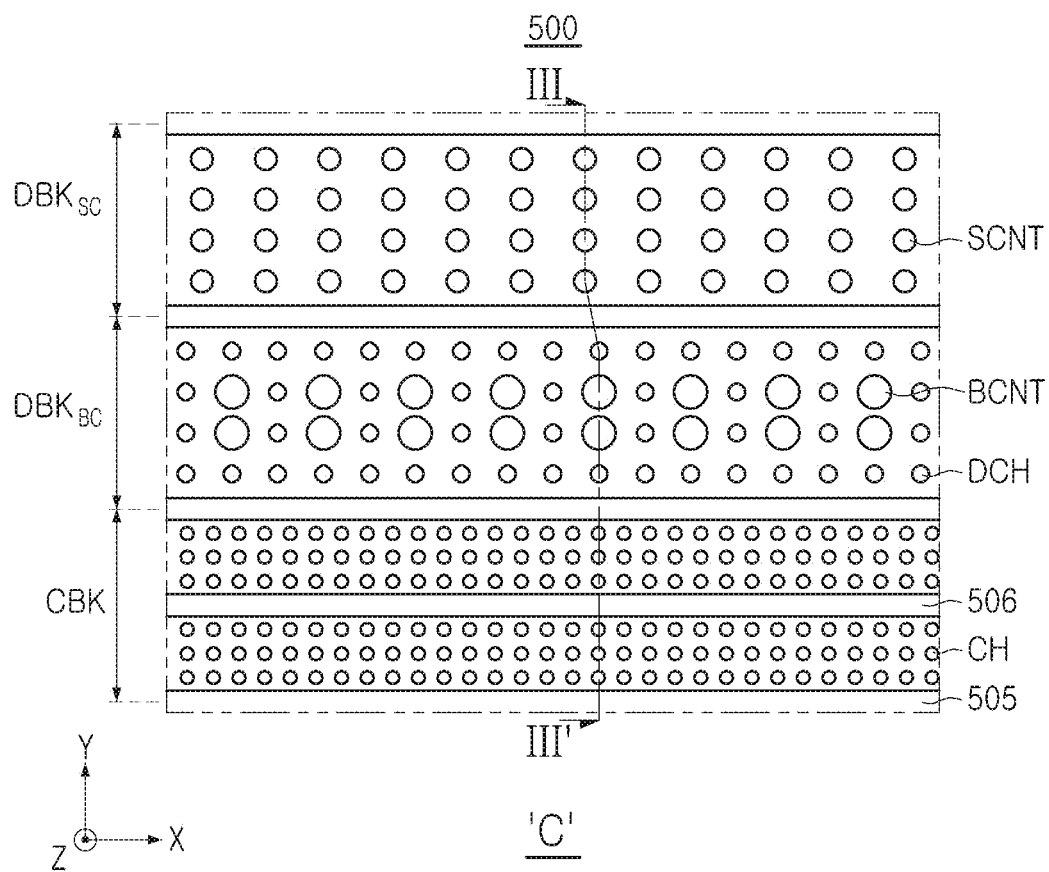
Figure 18:
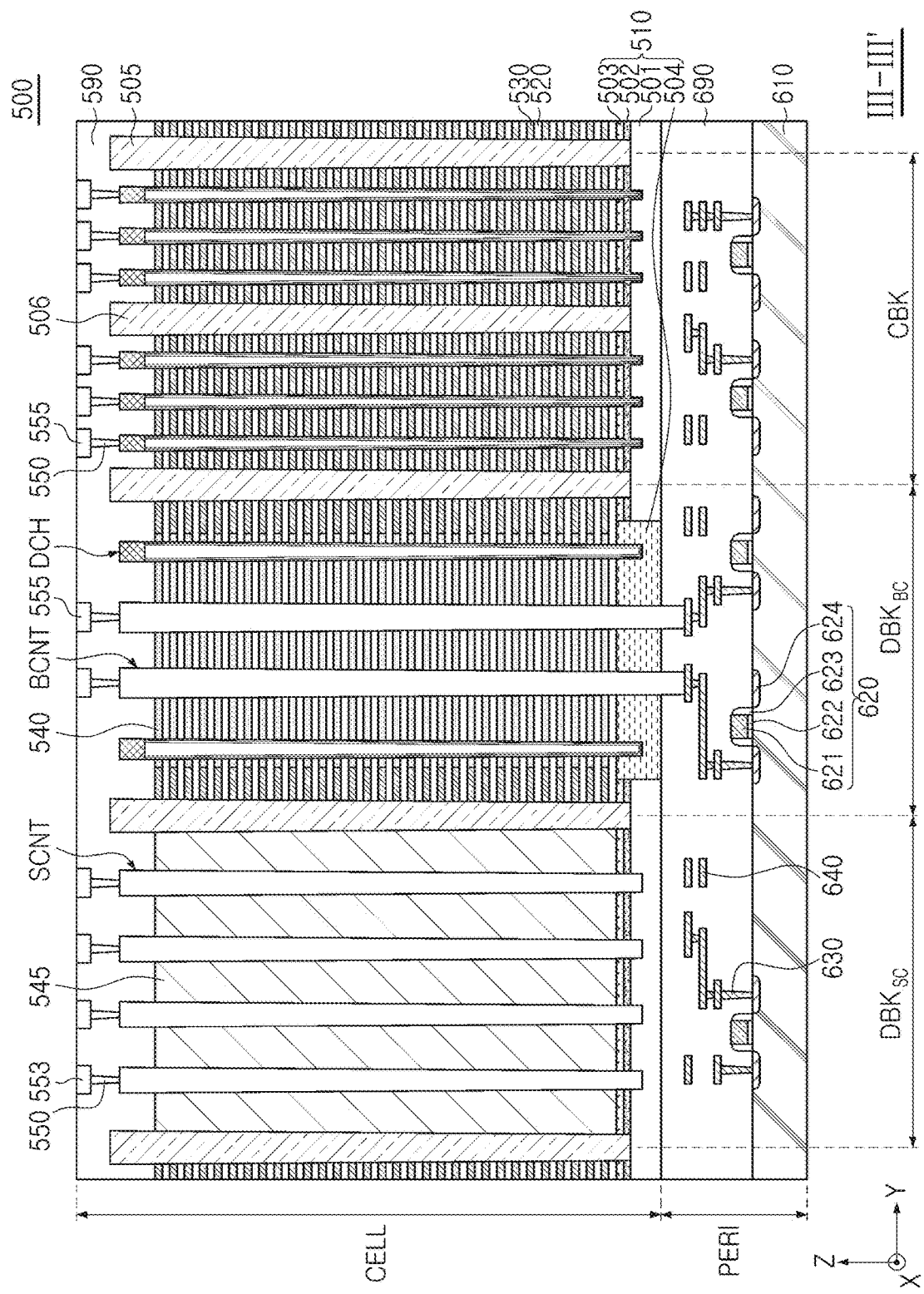
FIG. 18 is a cross-sectional view illustrating a cross section in the direction III-III' of FIG. 17.

FIGS. 16 and 17 are diagrams illustrating a structure of a memory device according to example embodiments. FIG. 18 is a cross-sectional view illustrating a cross section in the direction III-III' of FIG. 17.

FIG. 16 is a plan view illustrating a portion of a memory device 500 according to example embodiments. Referring to FIG. 16, the memory device 500 includes a peripheral circuit area and a cell area stacked in a first direction (Z-axis direction), and the cell area may be stacked on the peripheral circuit area. For example, the peripheral circuit area may include a source driver DRV connected to a source region formed on a substrate of the cell area. The source region formed on the substrate of the cell area may function as a common source line.

Referring to FIG. 16, the memory device 500 according to example embodiments may include a plurality of cell blocks CBK and a plurality of dummy blocks $DBK_{SC}$ and $DBK_{BC}$ arranged in the second direction (Y-axis direction). The plurality of cell blocks CBK and the plurality of dummy blocks $DBK_{SC}$ and $DBK_{BC}$ may be separated from each other in the second direction by separation layers 505, and the plurality of dummy blocks $DBK_{SC}$ and $DBK_{BC}$ may include source contact blocks $DBK_{SC}$ and bit line contact blocks $DBK_{BC}$.

The respective configurations of the cell blocks CBK, the source contact blocks $DBK_{SC}$, and the bit line contact blocks $DBK_{BC}$ may be similar to those described above with reference to FIGS. 7 to 10. On the other hand, in example embodiments illustrated in FIG. 16, at least one bit line contact block $DBK_{BC}$ may be adjacent to one cell block CBK and one source contact block $DBK_{SC}$ in the second direction. Referring to FIG. 16, at least one of the bit line contact blocks $DBK_{BC}$ may be disposed between the cell block CBK and the source contact block $DBK_{SC}$ in the second direction.

Referring to FIG. 17 illustrating an enlarged view of region C of FIG. 16, at least one bit line contact block $DBK_{BC}$ may be disposed between the source contact block $DBK_{SC}$ and the cell block CBK in the second direction. Although FIG. 17 illustrates that the source contact block $DBK_{SC}$ is disposed in the upper portion in the second direction and the cell block CBK is disposed in the lower portion in the second direction, the arrangement order may vary depending on example embodiments. In the memory device 500 according to example embodiments illustrated in FIGS. 16 and 17, it may be understood that at least one of the source contact blocks $DBK_{SC}$ is disposed between the bit line contact block $DBK_{BC}$ and the cell block CBK in the second direction.

Referring to FIG. 18, the memory device 500 may include a peripheral circuit area PERI and a cell area CELL, and the peripheral circuit area PERI and the cell area CELL may be stacked on each other in a first direction (Z-axis direction). The configuration of the peripheral circuit area PERI and the cell area CELL may be similar to those described above with reference to FIGS. 7 to 10.

Referring to FIG. 18, the source contact block $DBK_{SC}$ may be disposed on one side of the bit line contact block $DBK_{BC}$ in the second direction (Y-axis direction), and the cell block CBK may be disposed on the other side thereof. The bit line contacts BCNT disposed in the bit line contact block $DBK_{BC}$ may connect bit lines 555 to circuit elements 620 that provide a page buffer in the peripheral circuit area PERI. The source contacts SCNT disposed in the source contact block $DBK_{SC}$ are connected to dummy bit lines 553 and a second substrate 510, and may be connected to a source driver through dummy bit lines 553.

Figure 19:
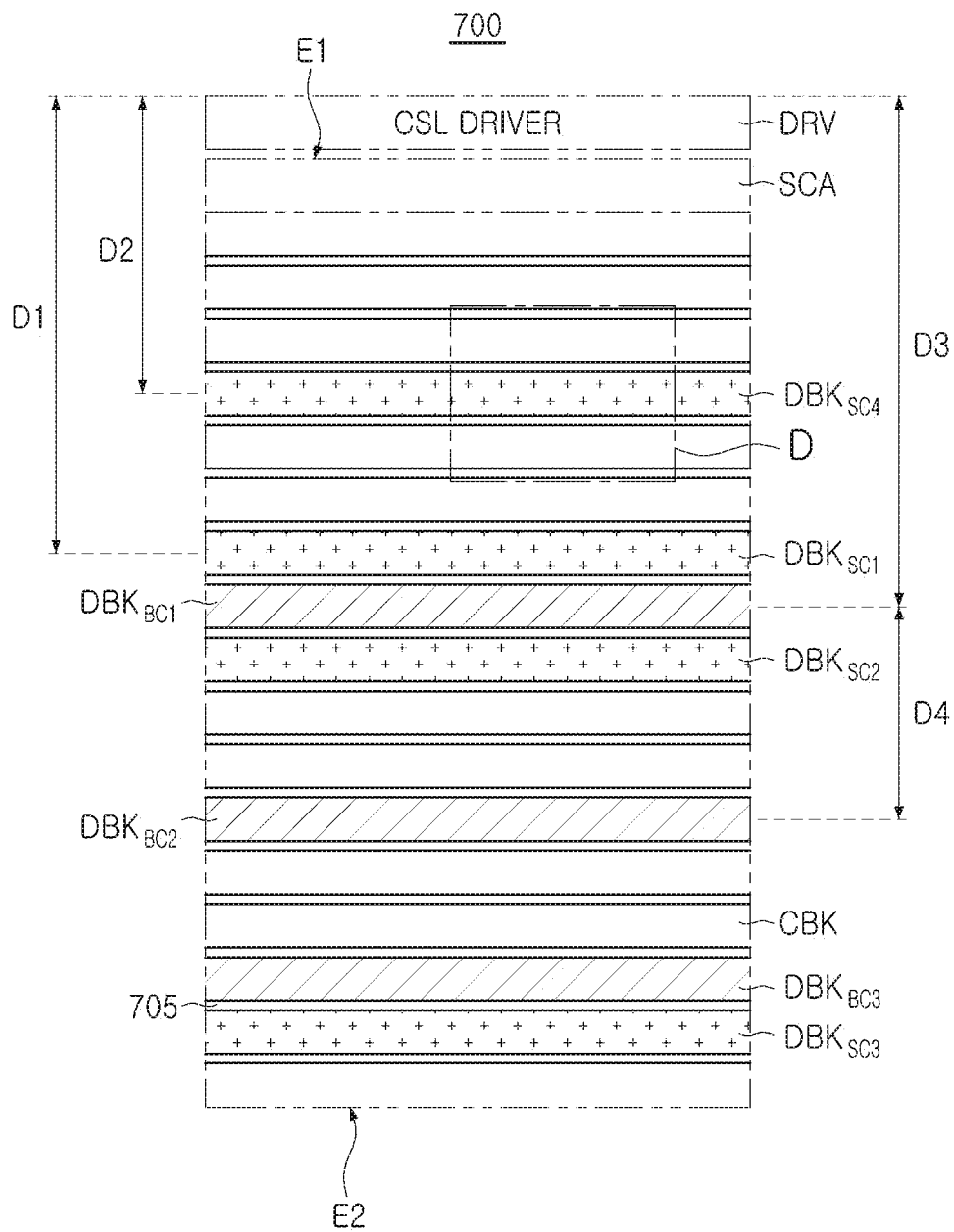
FIGS. 19 and 20 are diagrams illustrating a structure of a memory device according to example embodiments.
Figure 20:
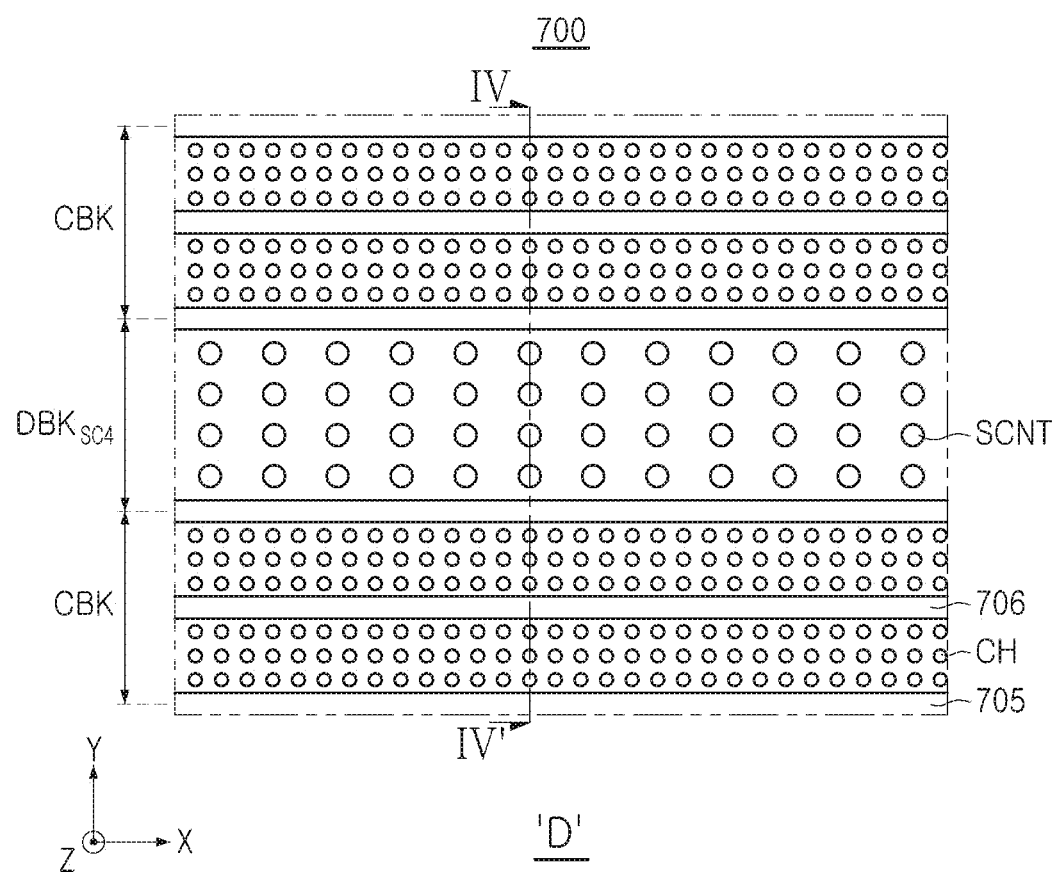
Figure 21:
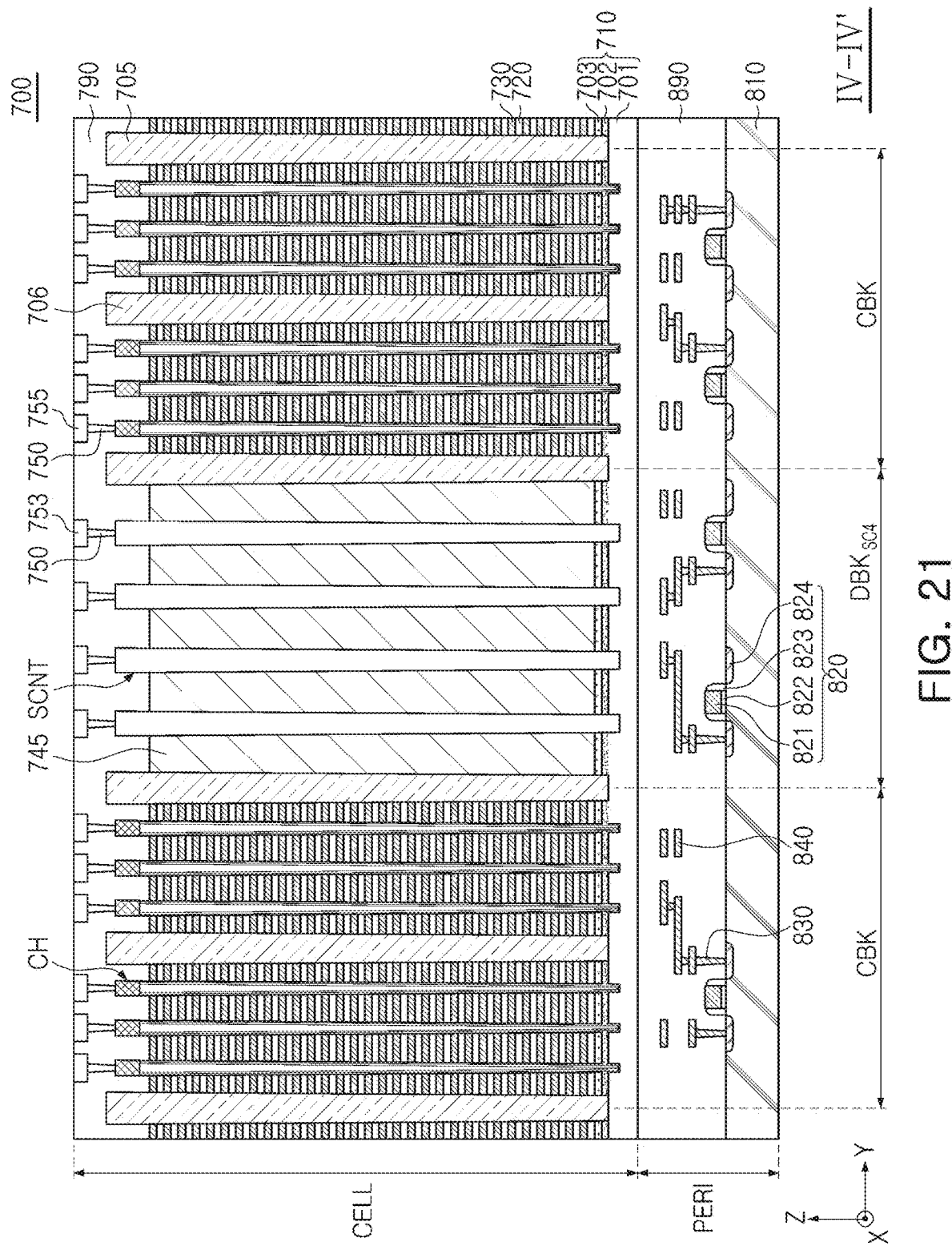
FIG. 21 is a cross-sectional view illustrating a cross section in the direction IV-IV' of FIG. 20.

FIGS. 19 and 20 are diagrams illustrating a structure of a memory device according to example embodiments. FIG. 21 is a cross-sectional view illustrating a cross section in the direction IV-IV' of FIG. 20.

FIG. 19 may be a plan view illustrating a portion of a memory device 700 according to example embodiments. Referring to FIG. 19, the memory device 700 includes a peripheral circuit area and a cell area stacked in a first direction (Z-axis direction), and the cell area may be stacked on the peripheral circuit area. For example, the peripheral circuit area may include a source driver DRV connected to a source region formed on a substrate of the cell area. The source driver DRV extends in the second direction (Y-axis direction) and may be disposed in the peripheral circuit area adjacent to at least one of a first edge E1 and a second edge E2 facing each other. For example, the first edge E1 and the second edge E2 may be edges of the substrate in the cell area.

Referring to FIG. 19, the memory device 700 according to example embodiments may include a plurality of cell blocks CBK and a plurality of dummy blocks $DBK_{SC1}$-$DBK_{SC4}$ and $DBK_{SC1}$-$DBK_{BC3}$ arranged in a second direction. The plurality of cell blocks CBK and the plurality of dummy blocks $DBK_{SC1}$-$DBK_{SC4}$ and $DBK_{SC1}$-$DBK_{BC3}$ are separated from each other by separation layers 705, and the plurality of dummy blocks $DBK_{SC1}$-$DBK_{SC4}$ and $DBK_{BC1}$-$DBK_{BC3}$ may include source contact blocks $DBK_{SC1}$ to $DBK_{SC4}$ and bit line contact blocks $DBK_{SC1}$ to $DBK_{BC3}$.

The respective configurations of the cell blocks CBK, the source contact blocks $DBK_{SC1}$-$DBK_{SC4}$, and the bit line contact blocks $DBK_{SC1}$-$DBK_{BC3}$ may be similar to those described above with reference to FIGS. 7 to 10. In example embodiments illustrated in FIG. 19, the first bit line contact block $DBK_{BC1}$ may be disposed between the first and second source contact blocks $DBK_{SC1}$ and $DBK_{SC2}$. On the other hand, the second bit line contact block $DBK_{BC2}$ may be disposed between a pair of cell blocks CBK, and the third bit line contact block $DBK_{BC3}$ may be disposed between one cell block CBK and the third source contact block $DBK_{SC3}$.

Also, referring to FIG. 19 and FIG. 20 illustrating an enlarged region D of FIG. 19, a fourth source contact block $DBK_{SC4}$ may be disposed between a pair of cell blocks CBK. In example embodiments illustrated in FIGS. 19 and 20, in a region in which the bit line contact blocks $DBK_{SC1}$ to $DBK_{BC3}$ are not formed, one of the cell blocks CBK is formed as a dummy block, and may be allocated as the fourth source contact block $DBK_{SC4}$.

In example embodiments in which the fourth source contact block $DBK_{SC4}$ is not present, an interval from the first edge E1 to the source contact block $DBK_{SC1}$ closest to the source driver DRV may be a first interval D1. By inserting the fourth source contact block $DBK_{SC4}$ between the first edge E1 and the first source contact block $DBK_{SC1}$, an interval from the first edge E1 to the source contact block $DBK_{SC4}$ closest to the source driver DRV may be shortened to a second interval D2. Accordingly, a voltage difference between source voltages input to the cell blocks CBK located around the fourth source contact block $DBK_{SC4}$ may be reduced, and performance of the memory device 700 may be improved.

In example embodiments illustrated in FIG. 19, the interval from the first edge E1 to the first bit line contact $DBK_{SC1}$ closest to the source driver DRV may be a third interval D3. On the other hand, an interval between the first bit line contact $DBK_{BC1}$ and the second bit line contact $DBK_{BC2}$ may be a fourth interval D4 less than the third interval D3. However, the size of each of the first to fourth intervals D1 to D4 is not limited to the illustration in FIG. 19 and may be variously modified as necessary.

Referring to FIG. 21, in the memory device 700, a peripheral circuit area PERI and a cell area CELL may be stacked on each other in the first direction (Z-axis direction). The configuration of the peripheral circuit area PERI and the cell area CELL may be similar to those described above with reference to FIGS. 7 to 9.

Referring to FIG. 21, cell blocks CBK may be adjacent to both sides of the fourth source contact block $DBK_{SC4}$ in the second direction (Y-axis direction). For example, unlike example embodiments of FIGS. 7, 8 and 18 in which the bit line contact block $DBK_{BC1}$ s disposed on at least one side of the source contact block $DBK_{SC}$ in the second direction, in example embodiments illustrated in FIG. 21, the fourth source contact block $DBK_{SC4}$ may be adjacent to only the cell blocks CBK in the second direction.

In example embodiments illustrated in FIG. 21, at least one of the cell blocks CBK may be selected and replaced with the fourth source contact block $DBK_{SC4}$. Accordingly, regardless of the positions of the bit line contact blocks $DBK_{BC1}$ to $DBK_{BC4}$, the fourth source contact block $DBK_{SC4}$ may be disposed in a position close to the source driver DRV, and the variation of the source voltage which may occur in the operation of the memory device 700 may be (significantly) reduced.

Figure 22:
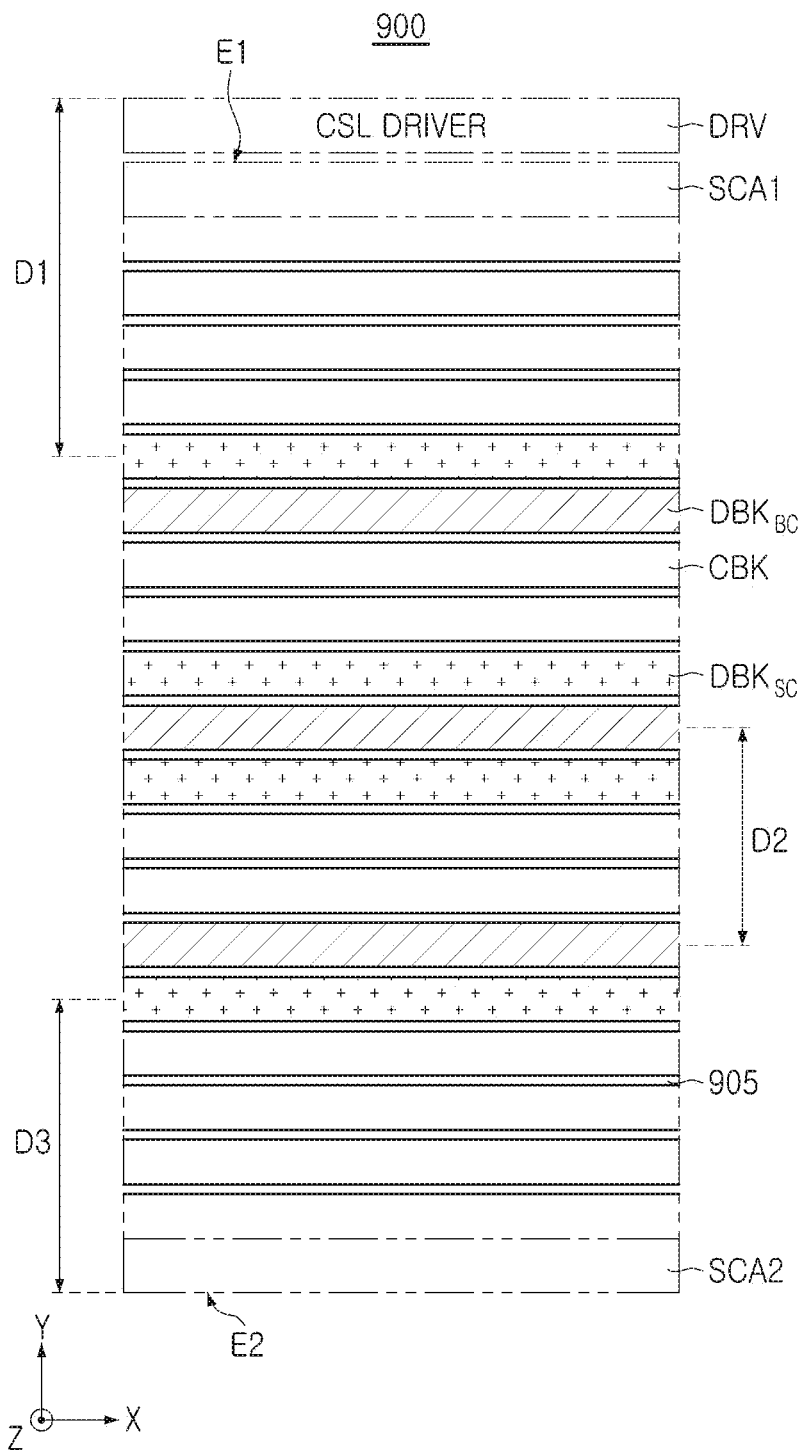
FIG. 22 is a diagram illustrating a structure of a memory device according to example embodiments.

FIG. 22 is a diagram illustrating a structure of a memory device according to example embodiments.

FIG. 22 is a plan view illustrating a portion of a memory device 900 according to example embodiments. Referring to FIG. 22, the memory device 900 may include a peripheral circuit area and a cell area stacked in a first direction (Z-axis direction), and the cell area may be stacked on the peripheral circuit area. For example, the peripheral circuit area may include a source driver DRV connected to a source region formed on a substrate of the cell area. The source driver DRV may extend in the second direction (Y-axis direction) and may be adjacent to at least one of a first edge E1 and a second edge E2 facing each other in a third direction (X-axis direction), in the peripheral circuit area. For example, the first edge E1 and the second edge E2 may be edges of the substrate in the cell area.

Referring to FIG. 22, a memory device 900 may include a plurality of cell blocks CBK and a plurality of dummy blocks $DBK_{SC}$ and $DBK_{BC}$ arranged in a second direction. The plurality of cell blocks CBK and the plurality of dummy blocks $DBK_{SC}$ and $DBK_{BC}$ are separated from each other by separation layers 905, and the plurality of dummy blocks $DBK_{SC}$ and $DBK_{BC}$ may include source contact blocks $DBK_{SC}$ and bit line contact blocks $DBK_{BC}$.

The respective configurations of the cell blocks CBK, the source contact blocks $DBK_{SC}$, and the bit line contact blocks $DBK_{BC}$ may be understood with reference to example embodiments illustrated in FIGS. 7 to 10 above. In example embodiments illustrated in FIG. 22, the bit line contact block $DBK_{BC}$ closest to the first edge E1 may be disposed between the cell block CBK and the source contact block $DBK_{SC}$. On the other hand, an interval between the source contact block $DBK_{SC}$ closest to the first edge E1 and the first edge E1 may be a first interval D1.

On the other hand, an interval between a pair of bit line contact blocks $DBK_{BC}$ adjacent to each other may be a second interval D2 less than the first interval D1. The second interval D2 may be less than a third interval D3, and the third interval D3 may be the interval between the source contact block $DBK_{SC}$ closest to the second edge E2 and the second edge E2. The first interval D1 and the third interval D3 may be the same or may be different depending on example embodiments.

In example embodiments illustrated in FIG. 22, a second source contact area SCA2 may be formed on the second edge E2 that is not adjacent to a source driver DRV. Edge source contacts are disposed in each of the first source contact area SCA1 and the second source contact area SCA2, and for example, the number of edge source contacts disposed in each of the first source contact area SCA1 and the second source contact area SCA2 may be the same as or different from each other. For example, the number of second edge source contacts disposed in the second source contact area SCA2 may be greater than the number of first edge source contacts disposed in the first source contact area SCA1. The edge source contacts may be connected to the source driver DRV through dummy bit lines and lower metal wirings disposed at the same height as bit lines.

Figure 23:
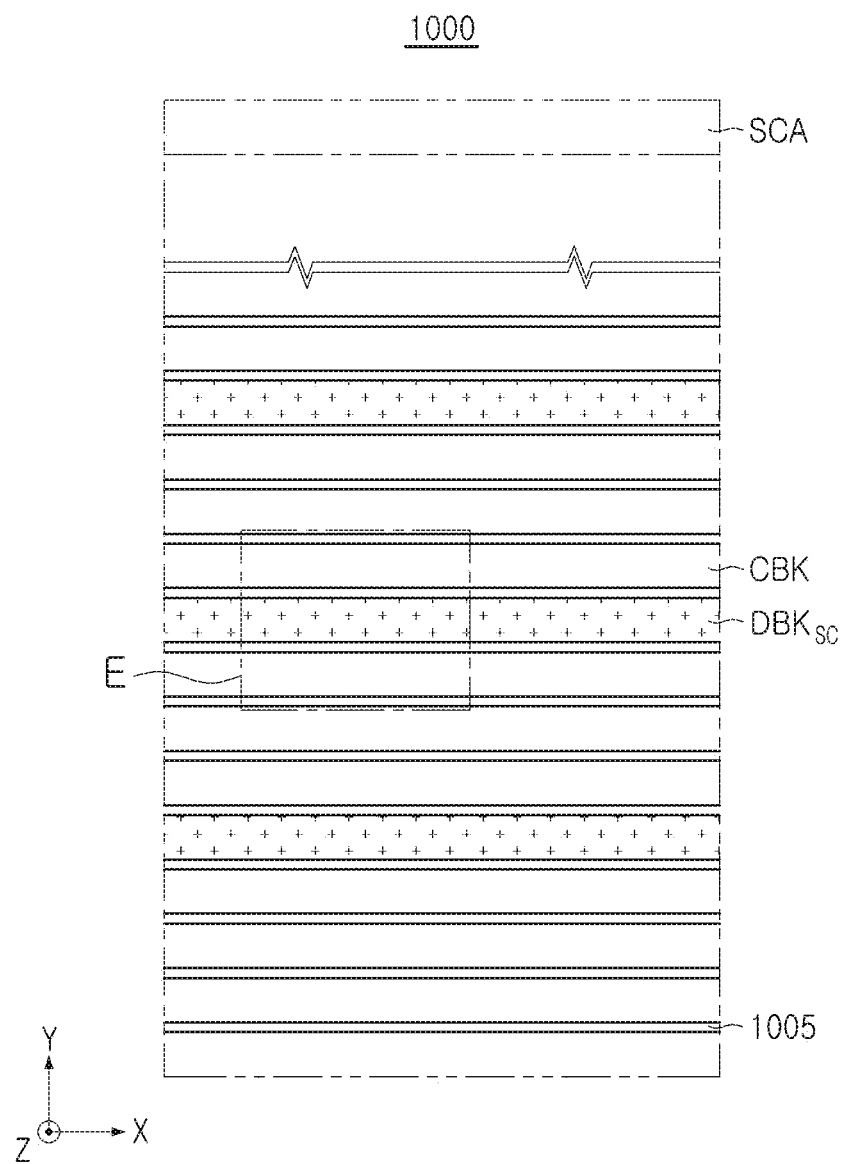
FIGS. 23 and 24 are diagrams to describe the structure of a memory device according to example embodiments.
Figure 24:
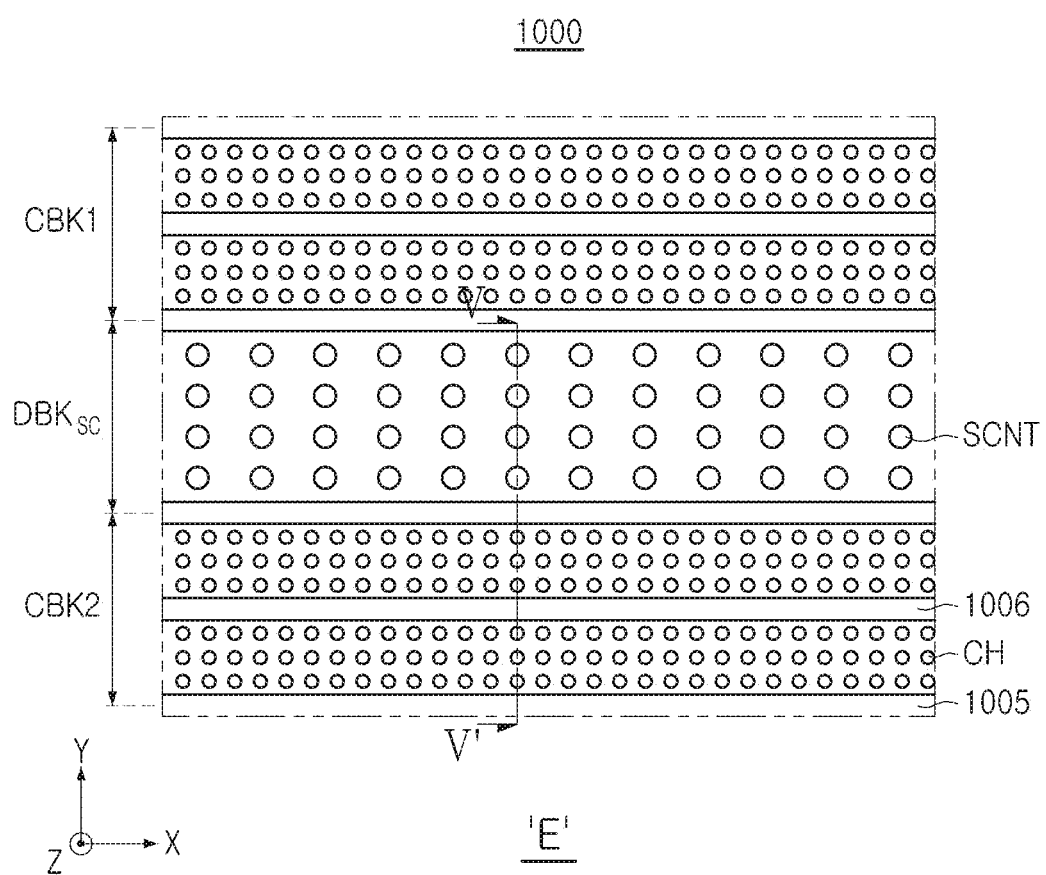
Figure 25:
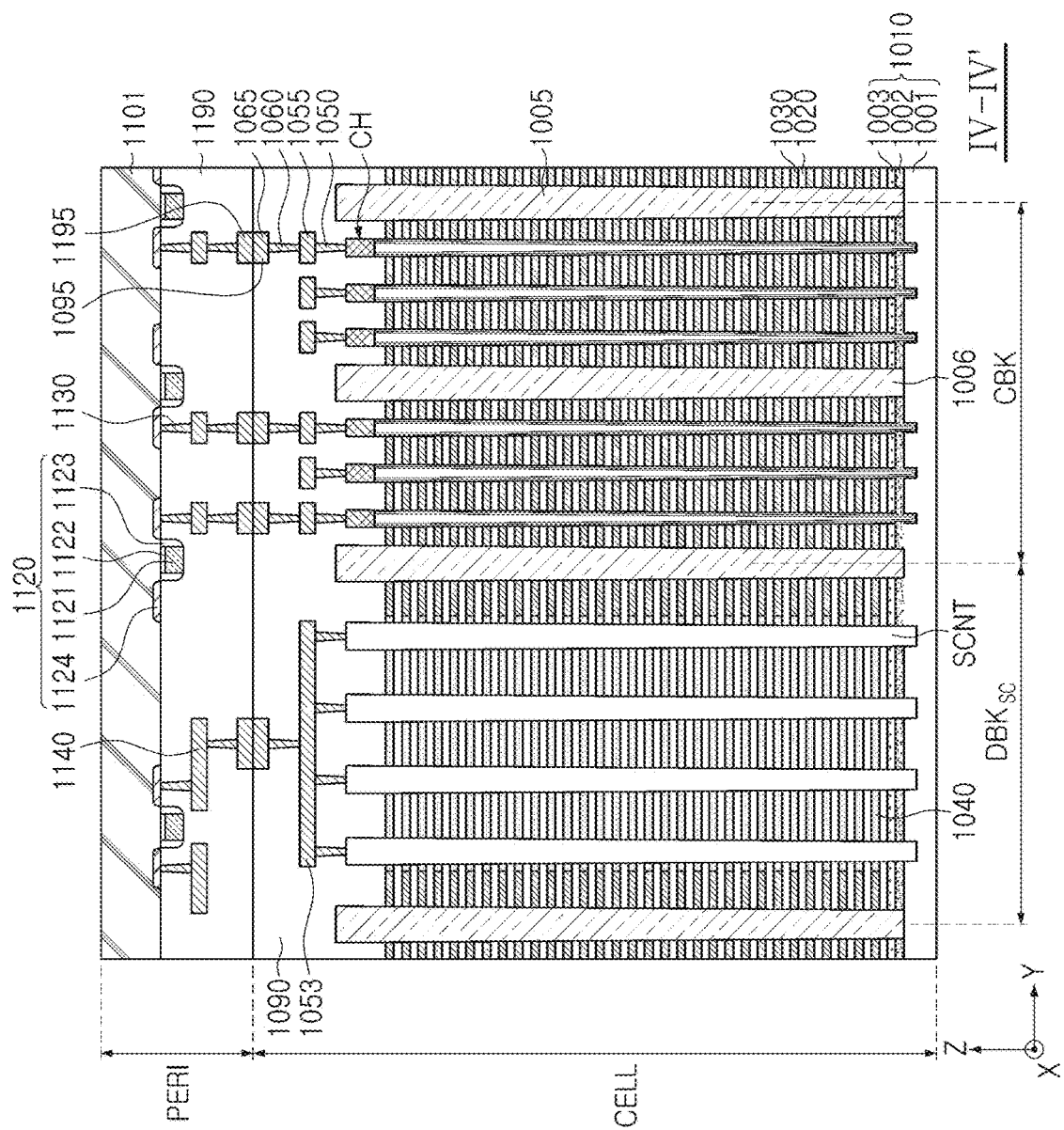
FIG. 25 is a cross-sectional view illustrating a cross section in the direction V-V' of FIG. 24.

FIGS. 23 and 24 are diagrams to describe the structure of a memory device according to example embodiments. FIG. 25 is a cross-sectional view illustrating a cross section in the direction V-V' of FIG. 24.

FIGS. 23 and 24 may be plan views illustrating a portion of a cell area in a memory device 1000 according to example embodiments. In example embodiments illustrated in FIGS. 23 to 25, the memory device 1000 may include a peripheral circuit area and a cell area stacked in a first direction (Z-axis direction), and the peripheral circuit area is disposed on the cell area.

Referring to FIGS. 23 and 24, the cell area may include a plurality of cell blocks CBK and source contact blocks $DBK_{SC}$ arranged in a second direction (Y-axis direction). Referring to FIG. 24 illustrating an enlarged view of region E of FIG. 23, each of the source contact blocks $DBK_{SC}$ may be disposed between a pair of cell blocks CBK1 and CBK2 in the second direction. However, according to example embodiments, two or more source contact blocks $DBK_{SC}$ may be continuously disposed in the second direction.

FIG. 25 may be a cross-sectional view illustrating a cross section in the direction V-V' of FIG. 24. Referring to FIG. 25, the peripheral circuit area PERI may be disposed on the cell area CELL in the first direction. The peripheral circuit area PERI includes a first substrate 1110, circuit elements 1120 formed on the first substrate 1110, circuit contacts 1130 and wiring patterns 1140 connected to the circuit elements 1120, and/or the like. The circuit elements 1120, circuit contacts 1130, and wiring patterns 1140 may be covered by a peripheral interlayer insulating layer 1190.

The cell area CELL may include a second substrate 1010, insulating layers 1020 and gate electrode layers 1030 alternately stacked on the second substrate 1010, channel structures CH extending in the first direction while penetrating through the insulating layers 1020 and the gate electrode layers 1030, separation layers 1005, and/or the like. The cell block CBK and the source contact block $DBK_{SC}$ may be separated from each other in the second direction by the separation layers 1005, and the cell block CBK may further include an intermediate separation layer 1006. Sacrificial layers 1040 may remain in a portion of the source contact block $DBK_{SC}$, and the source contacts SCNT may penetrate through the dummy insulating region provided by the insulating layers 1020 and the sacrificial layers 1040, to be connected to the second substrate 1010.

The cell area CELL may include a cell interlayer insulating layer 1090 covering the channel structures CH, the gate electrode layers 1030, and the source contacts SCNT and/or the like, and the channel structures CH and the source contacts SCNT may be connected to lower metal wirings 1053 and 1055 through the upper contact 1050. For example, the lower metal wirings 1053 connected to the channel structures CH may be bit lines, and the lower metal wirings 1055 connected to the source contacts SCNT may be dummy bit lines.

The lower metal wirings 1055 may be connected to cell pads 1095 through first wiring contacts 1060. The cell pads 1095 may be connected to peripheral pads 1195 included in the peripheral circuit area PERI and connected to the circuit elements 1120 through circuit contacts 1130 and wiring patterns 1140. In example embodiments, the cell pads 1095 and the peripheral pads 1195 may be bonding metal pads, and may be connected to each other by a Cu—Cu bonding method or the like. However, according to example embodiments, the cell pads 1095 and the peripheral pads 1195 may also be formed of aluminum or tungsten.

In example embodiments described with reference to FIGS. 23 to 25, the memory device 1000 may have a Chip to Chip (C2C) structure. For example, after forming a first chip including the peripheral circuit area PERI on a first wafer and forming a second chip including the cell area CELL on a second wafer different from the first wafer, the first chip and the second chip may be connected to each other through a bonding method, thereby forming the memory device 1000.

In example embodiments illustrated in FIG. 25, the circuit elements 1120 directly connected to the channel structures CH may provide a page buffer, and the circuit elements 1120 directly connected to the source contacts SCNT may provide the source driver. Since the peripheral circuit area PERI is disposed on an upper portion of the cell area CELL, not below the cell area CELL, and the cell pad 1095 and the peripheral pad 1195 are directly connected by a bonding method, the memory device 1000 may not include the bit line contact block in which the bit line contacts are disposed.

Figure 26:
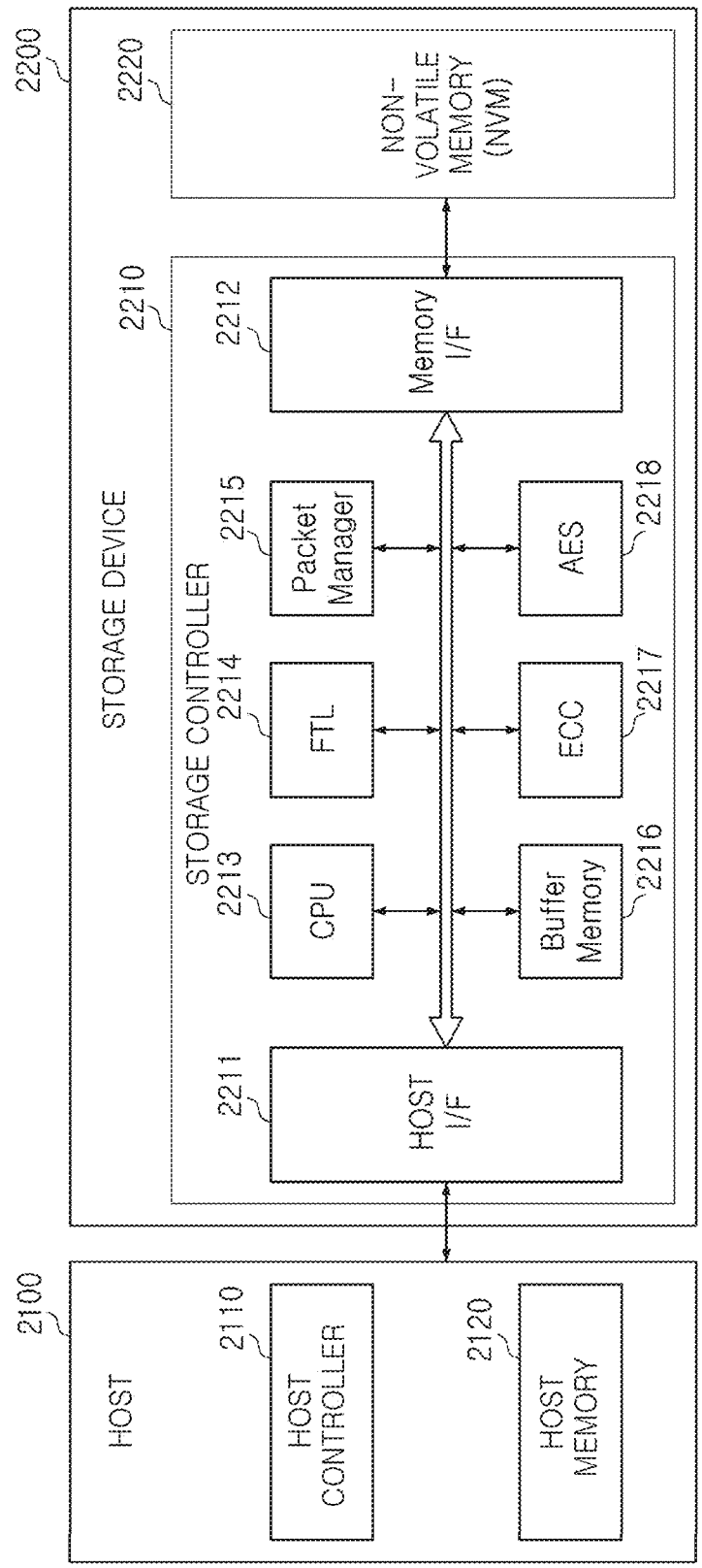
FIG. 26 is a block diagram illustrating a host-storage system according to example embodiments.

FIG. 26 is a block diagram illustrating a host-storage system according to example embodiments.

A host-storage system 2000 may include a host 2100 and a storage device 2200. Further, the storage device 2200 may include a storage controller 2210 and a nonvolatile memory (NVM) 2220. Further, according to example embodiments, the host 2100 may include a host controller 2110 and a host memory 2120. The host memory 2120 may function as a buffer memory for temporarily storing data to be transmitted to the storage device 2200 or data transmitted from the storage device 2200.

The storage device 2200 may include storage media for storing data according to a request from the host 2100. As an example, the storage device 2200 may include at least one of a solid state drive (SSD), an embedded memory, and a removable external memory. When the storage device 2200 is an SSD, the storage device 2200 may be a device conforming to the nonvolatile memory express (NVMe) standard. When the storage device 2200 is an embedded memory or an external memory, the storage device 2200 may be a device conforming to the universal flash storage (UFS) or embedded multi-media card (eMMC) standard. The host 2100 and the storage device 2200 may respectively generate a packet according to the adopted standard protocol and transmit the packet.

When the nonvolatile memory 2220 of the storage device 2200 includes a flash memory, the flash memory may include a 2D NAND memory array or a 3D (or vertical) NAND (VNAND) memory array. As another example, the storage device 2200 may include various other types of nonvolatile memories. For example, as the storage device 2200, magnetic RAM (MRAM), spin-transfer torque MRAM, conductive bridging RAM (CBRAM), ferroelectric RAM (FeRAM), phase RAM (PRAM), and resistive memory, and various other types of memories may be applied.

According to example embodiments, the host controller 2110 and the host memory 2120 may be implemented as separate semiconductor chips. Alternatively, in some example embodiments, the host controller 2110 and the host memory 2120 may be integrated in the same semiconductor chip. As an example, the host controller 2110 may be any one of a plurality of modules included in an application processor, and the application processor may be implemented as a system on chip (SoC). In addition, the host memory 2120 may be an embedded memory provided in the application processor, or may be a nonvolatile memory or a memory module disposed outside of the application processor.

The host controller 2110 may manage an operation of storing data (e.g., write data) of the host memory 2120 in the nonvolatile memory 2220 or storing data (e.g., read data) of the nonvolatile memory 2220 in the host memory 2120.

The storage controller 2210 may include a host interface 2211, a memory interface 2212, and/or a central processing unit (CPU) 2213. In addition, the storage controller 2210 may further include a flash translation layer (FTL) 2214, a packet manager 2215, a buffer memory 2216, an error correction code (ECC, 2217) engine, and/or an advanced encryption standard (AES, 218) engine. The storage controller 2210 may further include a working memory in which the flash translation layer (FTL) 2214 is loaded, and may control data writing and reading operations for the nonvolatile memory by the CPU 2213 executing the flash translation layer.

The host interface 2211 may transmit and receive a packet with the host 2100. The packet transmitted from the host 2100 to the host interface 2211 may include a command or data to be recorded in the nonvolatile memory 2220, and/or the like, and the packet transmitted from the host interface 2211 to the host 2100 may include a response to a command, or data read from the nonvolatile memory 2220, and/or the like. The memory interface 2212 may transmit data to be written to the nonvolatile memory 2220, to the nonvolatile memory 2220, or may receive data read from the nonvolatile memory 2220. The memory interface 2212 may be implemented to comply with standard protocol such as toggle or ONFI.

The flash translation layer 2214 may perform various functions such as address mapping, wear-leveling, and garbage collection. The address mapping operation is an operation of converting a logical address received from a host into a physical address used to actually store data in the nonvolatile memory 2220. The wear-leveling is a technology for reducing or preventing excessive deterioration of a specific block by allowing blocks in the nonvolatile memory 2220 to be used evenly, and as an example, may be implemented by a firmware technology that balances erase counts of physical blocks. Garbage collection is a technology for securing usable capacity in the nonvolatile memory 2220 by a method of copying valid data of a block to a new block and then erasing the existing block.

The packet manager 2215 may generate a packet according to a protocol of an interface negotiated with the host 2100 or may parse various information from a packet received from the host 2100. Further, the buffer memory 2216 may temporarily store data to be written to the nonvolatile memory 2220 or data to be read from the nonvolatile memory 2220. The buffer memory 2216 may be a configuration provided in the storage controller 2210, but may also be disposed outside of the storage controller 2210.

The ECC engine 2217 may perform an error detection and correction function for read data read from the nonvolatile memory 2220. In more detail, the ECC engine 2217 may generate parity bits for write data to be written to the nonvolatile memory 2220, and the parity bits generated as described above may be stored in the nonvolatile memory 2220 together with the write data. When reading data from the nonvolatile memory 2220, the ECC engine 2217 may correct an error in the read data using the parity bits read from the nonvolatile memory 2220 together with the read data, and may output the error-corrected read data.

The AES engine 2218 may perform at least one of an encryption operation and a decryption operation for data input to the storage controller 2210, using a symmetric-key algorithm.

As set forth above, according to example embodiments, source contacts connected to a common source line may be disposed in at least one of dummy blocks disposed between cell blocks in a cell area. Therefore, the voltage output from a source driver may be input to the common source line through source contacts disposed between the cell blocks, and the difference in the voltage of the common source line occurring depending on the locations of the respective cell blocks and/or a position thereof within one cell block may be (significantly) reduced. By (significantly) reducing the difference between the common source line voltage, the operating characteristics and/or reliability of the memory device may be improved.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of the present inventive concepts as defined by the appended claims.

What is claimed is:

1. A memory device comprising:
a peripheral circuit area including a first substrate and circuit elements on the first substrate, at least a portion of the circuit elements providing a source driver; and
a cell area including a second substrate stacked with the peripheral circuit area in a first direction, perpendicular to an upper surface of the first substrate, and cell blocks and dummy blocks arranged in a second direction, parallel to an upper surface of the second substrate and separated by separation layers extending in a third direction intersecting the second direction,
wherein each of the cell blocks includes gate electrode layers and insulating layers alternately stacked on the second substrate, and channel structures extending in the first direction to penetrate through the gate electrode layers and the insulating layers and to be connected to the second substrate,
at least one source contact block, among the dummy blocks, includes a first dummy insulating region on the second substrate, and source contacts extending in the first direction, penetrating through the first dummy insulating region and connected to the second substrate, in the source contact block, the source contacts are disposed between a pair of the separation layers adjacent with each other in the second direction, and
the source contacts are connected to the source driver through metal wirings extending in the second direction in an upper portion of the cell area.

2. The memory device of claim 1, wherein the first dummy insulating region includes dummy sacrificial layers and the insulating layers alternately stacked on the second substrate.

3. The memory device of claim 1, wherein the dummy blocks include bit line contact blocks having a structure different from a structure of the source contact block,
wherein each of the bit line contact blocks include a second dummy insulating region on the second substrate, and dummy channel structures extending in the first direction within the second dummy insulating region.

4. The memory device of claim 3, wherein the cell area further includes bit lines extending in the second direction and above the channel structures while being connected to the channel structures,
  wherein the bit line contact blocks include bit line contacts connected to the bit lines and extending to the peripheral circuit area in the first direction.

5. The memory device of claim 4, wherein the bit line contacts are connected to a page buffer included in the peripheral circuit area.

6. The memory device of claim 4, wherein the cell area further includes dummy bit lines extending in the second direction and at the same height as the bit lines,
  wherein the dummy bit lines provide the metal wirings connected to the source contacts.

7. The memory device of claim 1, further comprising:
  edge source contacts adjacent to one of a first edge and a second edge extending in a third direction intersecting the second direction among edges of the second substrate, and extending in the first direction and connected to the second substrate.

8. The memory device of claim 7, wherein a number of the edge source contacts is greater than a number of the source contacts in the one source contact block.

9. The memory device of claim 7, wherein the source driver is adjacent to at least one of the first edge and the second edge.

10. The memory device of claim 7, wherein a distance between a dummy block closest to the first edge in the second direction, among the dummy blocks, and the first edge, is greater than a distance between a pair of dummy blocks closest to each other in the second direction.

11. The memory device of claim 1, wherein the circuit elements, the gate electrode layers, and the channel structures are between the first substrate and the second substrate in the first direction.

12. A memory device comprising:
  a peripheral circuit area including circuit elements providing a source driver, a row decoder and a page buffer; and
  a cell area on the peripheral circuit area in a first direction and including blocks arranged in a second direction intersecting the first direction, the blocks being separated from each other by separation layers extending in a third direction intersecting the second direction,
  wherein the blocks include a cell block in which memory cells are disposed, a source contact block in which source contacts extending in the first direction and connected to a source region of the cell area are disposed, in the source contact block, the source contacts are disposed between a pair of the separation layers adjacent with each other in the second direction, and a bit line contact block in which bit line contacts extending in the first direction and connected to the page buffer are disposed, and
  the source contact block is adjacent to at least one of the cell block and the bit line contact block in the second direction.

13. The memory device of claim 12, wherein the cell block includes a plurality of cell blocks in different positions in the second direction, the source contact block includes a plurality of source contact blocks in different positions in the second direction, and the bit line contact block includes a plurality of bit line contact blocks in different positions in the second direction.

14. The memory device of claim 13, wherein the plurality of bit line contact blocks includes a first bit line contact block and a second bit line contact block,
  the first bit line contact block is adjacent to a first source contact block and a second source contact block of the source contact blocks in the second direction, and
  the second bit line contact block of the bit line contact blocks is adjacent to a first cell block and a second cell block of the cell blocks in the second direction.

15. The memory device of claim 14, wherein each of the source contact blocks is adjacent to one of the cell blocks and one of the bit line contact blocks in the second direction.

16. The memory device of claim 13, wherein the cell area includes a cell substrate on the peripheral circuit area and including the source region, and first edge source contacts adjacent to a first edge, extending in the second direction, of the cell substrate, and connected to the source region.

17. The memory device of claim 16, wherein the bit line contact blocks include a first bit line contact block and a second bit line contact block, and
  a distance between the first edge and the first bit line contact block is less than a distance between the first edge and the second bit line contact block.

18. The memory device of claim 17, wherein the distance between the first edge and the first bit line contact block is greater than the distance between the first bit line contact block and the second bit line contact block.

19. A memory device comprising:
  a cell area including a substrate having a source region, gate lines stacked in a first direction, perpendicular to an upper surface of the substrate, channel layers extending in the first direction and penetrating through the gate lines and connected to the source region, and source contacts extending in the first direction and connected to the source region and separated from the gate lines in a second direction, parallel to the upper surface of the substrate, and separation layers dividing the gate lines into a plurality of areas and extending in a third direction intersecting the second direction; and
  a peripheral circuit area below the cell area in the first direction and including a source driver electrically connected to the source region,
  wherein lower metal wirings connected to the source contacts and extending in the second direction are at a first height from the upper surface of the substrate, upper metal wirings connected to the lower metal wirings are at a higher level than the first height, and a through-wiring connecting the upper metal wirings to the source driver extends in the first direction, and
  the source contacts are separated from the separation layers in the second direction.

20. The memory device of claim 19, wherein the upper metal wirings further include first upper metal wirings connected to the lower metal wirings at a second height higher than the first height, and second upper metal wirings connected to the first upper metal wirings at a third height higher than the second height, and
  the through-wiring connects the second upper metal wirings to the source driver.

* * * * *